US010453949B2

(12) United States Patent
Morikawa et al.

(10) Patent No.: US 10,453,949 B2
(45) Date of Patent: Oct. 22, 2019

(54) SEMICONDUCTOR DEVICE AND METHOD OF MANUFACTURING THE SAME

(71) Applicant: HITACHI, LTD., Chiyoda-ku, Tokyo (JP)

(72) Inventors: Takahiro Morikawa, Tokyo (JP); Naoki Watanabe, Tokyo (JP); Hiroyuki Yoshimoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/625,178

(22) Filed: Jun. 16, 2017

(65) Prior Publication Data
US 2018/0026127 A1    Jan. 25, 2018

(30) Foreign Application Priority Data

Jul. 25, 2016    (JP) .................... 2016-145289

(51) Int. Cl.
*H01L 29/78*    (2006.01)
*H01L 29/06*    (2006.01)
*H01L 29/08*    (2006.01)
*H01L 29/10*    (2006.01)
*H01L 29/16*    (2006.01)
*H01L 29/66*    (2006.01)
*H01L 21/04*    (2006.01)
*H01L 29/20*    (2006.01)

(52) U.S. Cl.
CPC ...... *H01L 29/7802* (2013.01); *H01L 29/0657* (2013.01); *H01L 29/0688* (2013.01); *H01L 29/0696* (2013.01); *H01L 29/0865* (2013.01); *H01L 29/1033* (2013.01); *H01L 29/1041* (2013.01); *H01L 29/1095* (2013.01); *H01L 29/1608* (2013.01); *H01L 29/66068* (2013.01); *H01L 29/66712* (2013.01); *H01L 21/047* (2013.01); *H01L 21/0465* (2013.01); *H01L 29/2003* (2013.01)

(58) Field of Classification Search
CPC ............. H01L 29/7802; H01L 21/0465; H01L 21/047; H01L 29/0657; H01L 29/0688
See application file for complete search history.

(56) References Cited

U.S. PATENT DOCUMENTS

2015/0084066 A1*    3/2015   Banerjee ................. H01L 21/22
                                                                    257/77

FOREIGN PATENT DOCUMENTS

JP    2009-147381 A    7/2009

* cited by examiner

*Primary Examiner* — Zandra V Smith
*Assistant Examiner* — Andre C Stevenson
(74) *Attorney, Agent, or Firm* — Miles & Stockbridge PC

(57) ABSTRACT

A semiconductor device has an active region in which a plurality of unit cells are regularly arranged, each of the unit cells including: a channel region having a first conductivity type and formed over a front surface of a semiconductor substrate; a source region having a second conductivity type different from the first conductivity type and formed over the front surface of the semiconductor substrate in such a manner as to be in contact with the channel region; and a JFET region having the second conductivity type and is formed over the front surface of the semiconductor substrate on the opposite side of the channel region from the source region in such a manner as to be in contact with the channel region. The channel region is comprised of a first channel region and a second channel region higher than the first channel region in impurity concentration, over the front surface of the semiconductor substrate.

9 Claims, 35 Drawing Sheets

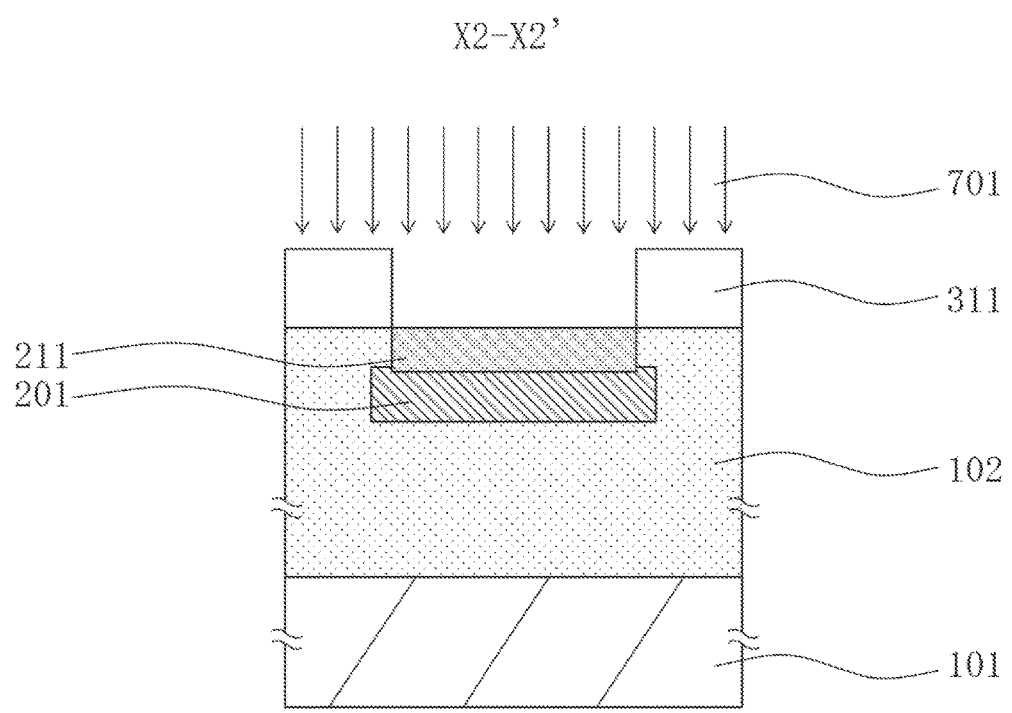

X4-X4'

X1-X1'

(a)

(b)　　　(c)

SEMICONDUCTOR DEVICE AND METHOD OF MANUFACTURING THE SAME

BACKGROUND OF THE INVENTION

1. Field of the Invention

The present disclosure relates to a semiconductor device and a method of manufacturing the same. Particularly, the present disclosure relates to a technology which is effective when applied to a semiconductor device comprised of a power semiconductor switching device using a wide-gap semiconductor and to a method of manufacturing the same.

2. Description of the Related Art

In recent years, in view of such problems as global warming and anxiety about the supply of fossil fuels, attention has been paid to power electronics as a technology for promoting effective use of energy. Power electronics apparatuses are in charge of conversion and control of electric power, and there is a demand for enhancement of the performance of power semiconductor devices constituting a key to the power electronics apparatuses.

For power semiconductor devices, silicon (Si) substrates have long been used. With respect to Si power semiconductor devices, improvements for achieving a lower loss and higher performance have hitherto been made. As a result, the device performances of them have been approaching theoretical limits determined by the properties of the Si material, and, therefore, it has come to be difficult to achieve further enhancement of the performances in the future.

Under such circumstances, researches of low-loss power semiconductor devices using silicon carbide (SiC) or gallium nitride (GaN) have been made energetically. Silicon carbide (SiC) and gallium nitride (GaN) are higher than silicon (Si) in dielectric breakdown field intensity by about one order of magnitude, which enables a thinner drift layer. Therefore, the power semiconductor devices using the wide-gap semiconductor can achieve a lower ON resistance, and hence a lower loss, as compared with the Si power semiconductors.

As an example of power metal-oxide-semiconductor field-effect-transistor (MOSFET) conventionally used, a vertical double diffused MOS (DMOS) FET will be described below.

FIG. 1 is a top plan view of a typical DMOSFET semiconductor chip. A terminal end region 1001 is provided in an outer peripheral portion of the semiconductor chip. An active region 1002 and a gate pad region 1003 are provided on the inside of the terminal end region 1001. In the active region 1002, a multiplicity of unit cells constituting the MOSFET structure are regularly arranged.

FIG. 2 is a major part sectional view of a unit cell of a typical vertical DMOSFET structure. On a major surface of an $n^+$-type SiC substrate 101 is provided an epitaxial layer 102 also composed of SiC, and a gate insulating film 221 and a gate electrode 222 are formed over the epitaxial layer 102. The front surface and side surfaces of the gate electrode 222 are covered with an interlayer insulating film 231. A source electrode 232 is formed in contact with the front surface of the epitaxial layer 102, in a source contact region 230 opened in the interlayer insulating film 231. On the back surface of the SiC substrate 101 is provided a drain electrode 103.

A p-type body region 201 is formed in the vicinity of the front surface of the epitaxial layer 102. An n-type source region 211 and a $p^+$-type body contact region 202 containing a p-type impurity at a higher concentration than the p-type body region 201 are formed in the inside of the p-type body region 201. The source electrode 232 is formed in contact with, and in electrical connection to, the front surfaces of the n-type source region 211 and the $p^+$-type body contact region 202. Therefore, the n-type source region 211 and the $p^+$-type body contact region 202 are electrically short-circuited through the source electrode 232.

When a positive voltage is impressed on the gate electrode 222, a channel region is formed in that portion of the p-type body region 201 which is contacted by the gate insulating film 221 on the front surface side, and electrons flow from the n-type source region 211 toward the drain electrode 103 through the channel. Thus, a switching operation is performed by impressing a voltage on the gate electrode 222. A plurality of the unit cells are regularly and densely arranged in the active region, while sharing the source electrode 232, and they are connected in parallel on an electrical basis. By increasing the number of the unit cells connected in parallel, or the number of the unit cells laid over the active region, and enlarging the width of the channel regions arranged in the active region, a reduction in the resistance of the MOSFET chip as a whole can be realized.

FIGS. 3A and 3B show an example of top view layout of the unit cells arranged in the active region. Typically, the layouts shown in FIGS. 3A and 3B are used. In FIGS. 3A and 3B, there are shown, in top plan view, the n-type source regions 211, the channel regions at the front surface of the p-type body regions 201, the $p^+$-type body contact regions 202, and the source contact regions 230, which are formed over the front surface of the epitaxial layer 102 of the DMOSFET structure.

The unit cell 1011 in FIG. 3A has an elongated belt-like shape, and the channel region is formed along the lengthwise direction of the belt. The sectional structure of the unit cell 1011 shown in FIG. 2 depicts the section along a cutting plane line X-X' of FIG. 3A.

The unit cell in FIG. 3B has a tetragonal shape, and the channel region is formed along the four edges of the tetragon. The sectional structure of the unit cell shown in FIG. 2 depicts the section along a cutting plane line X-X' and a cutting plane line Y-Y' of FIG. 3B. In the tetragonal cells, the length of the channel regions arranged in the active region can be enlarged as compared to the belt-shaped cells, so that the tetragonal cell is advantageous from the viewpoint of lowering of resistance in a conduction state.

SUMMARY OF THE INVENTION

In the manufacture of a SiC DMOSFET, the formation of the DMOSFET structure such as the n-type source regions and the p-type body regions is conducted by selective ion implantation. In the impurity ion implantation, lithography is usually conducted for each of the n-type source region and the p-type body region, to perform implantation while using separate masks.

In the case of using the separate masks for the ion plantation for the n-type source regions and that for the p-type body regions, mask registration in the two lithographic steps constitutes a problem in the manufacture. Where a stepper is used, typically, a registration error of 0.1 to 0.3 µm is generated. In addition, the size (pattern) of the resist mask formed upon development may be shifted due to small variations in the exposure dose or temperature. Since the channel length is usually less than 1 µm, variations and variability in device performance arising from the registration errors and pattern shift are not negligible.

In addition, although a shorter channel length is preferable for obtaining a lower ON resistance, too short a channel length would bring about punch-through, resulting in a defect that a predetermined breakdown voltage cannot be maintained. Therefore, a center value of the channel length should be designed with a sufficient margin such as to prevent the generation of punch-through even with the shorter channel length due to the registration error; however, the provision of such a margin would lead to increases in ON resistance and switching loss.

To cope with the above-mentioned registration error problem, a so-called self-alignment process has been proposed in which the body regions and the source regions are formed by only one lithographic step. According to the self-alignment process, the channel length can be determined without being influenced by registration errors or pattern shift which might arise from exposure conducted twice as described above, so that a short-channel low-ON-resistance MOSFET can be manufactured without variability.

As an example of the self-alignment process, JP-2009-147381-A discloses a method of manufacturing a vertical MOSFET in which ion implantation for forming source regions and ion implantation for forming channel regions are conducted using the same mask. However, the manufacturing method described in JP-2009-147381-A has the following problems.

According to the method of JP-2009-147381-A, using a mask material having a tapered shape, an n-type impurity for a source region is implanted in the direction of the normal to a substrate surface, and further, a p-type impurity is implanted in a direction inclined relative to the normal to the substrate, to form a channel in the form of penetrating beneath the mask. For forming the channel by implanting ions deep beneath the mask, it is efficient to implant the ions in a direction perpendicular to the outline of an opening portion in the mask. This approach is effective for a belt-like unit cell as shown in FIG. 3A. However, for example in the case of a tetragonal unit cell as depicted in FIG. 3B, if ions are implanted at the four edges of the tetragon in directions perpendicular to the respective edges, the impurity are not necessarily implanted sufficiently into the corner portions of the tetragon. If the corner portions are low in impurity concentration, there would arise, for example, a problem that a predetermined breakdown voltage cannot be maintained.

Thus, there is a need for a silicon carbide semiconductor device that has a lower ON resistance and high reliability, and an easier method of manufacturing the silicon carbide semiconductor device. The above-described and other objects of the present disclosure will become apparent from the following description of embodiments with reference to the accompanying drawings.

In an aspect of the present disclosure, there is disclosed a semiconductor device having an active region in which a plurality of unit cells are regularly arranged, each of the unit cells including: a channel region formed over a front surface of a semiconductor substrate and having a first conductivity type; a source region having a second conductivity type different from the first conductivity type and formed over the front surface of the semiconductor substrate such as to be in contact with the channel region; and a JFET region having the second conductivity type and formed over the front surface of the semiconductor substrate on an opposite side of the channel region from the source region such as to be in contact with the channel region. The channel region is comprised of a first channel region and a second channel region higher than the first channel region in impurity concentration.

In another aspect of the present disclosure, there is disclosed a method of manufacturing a semiconductor device, including: a step of forming a mask over a semiconductor substrate; a channel implantation step of implanting an impurity of a first conductivity type, with the mask as a shielding film; and a source implantation step of implanting an impurity of a second conductivity type different from the first conductivity type, with the mask as a shielding film. The channel implantation step is conducted in a direction inclined relative to a normal to the semiconductor substrate, and includes four times implantations by each rotating the semiconductor substrate by 90 degrees.

According to the semiconductor device disclosed herein, a high-performance vertical DMOSFET having both a high breakdown voltage and high reliability can be provided. In addition, according to the method of manufacturing a semiconductor device disclosed herein, a high-performance MOSFET in which a source region and a base region are formed on a self-alignment basis can be manufactured by use of a mask formed by lithography conducted only once.

BRIEF DESCRIPTION OF THE DRAWINGS

FIG. 7B is a sectional view of the unit cell in the sectional plane X2-X2', in a step subsequent to FIG. 6B of the manufacturing method of the SiC power MOSFET according to Embodiment 1;

DESCRIPTION OF THE PREFERRED EMBODIMENTS

Figure 1:
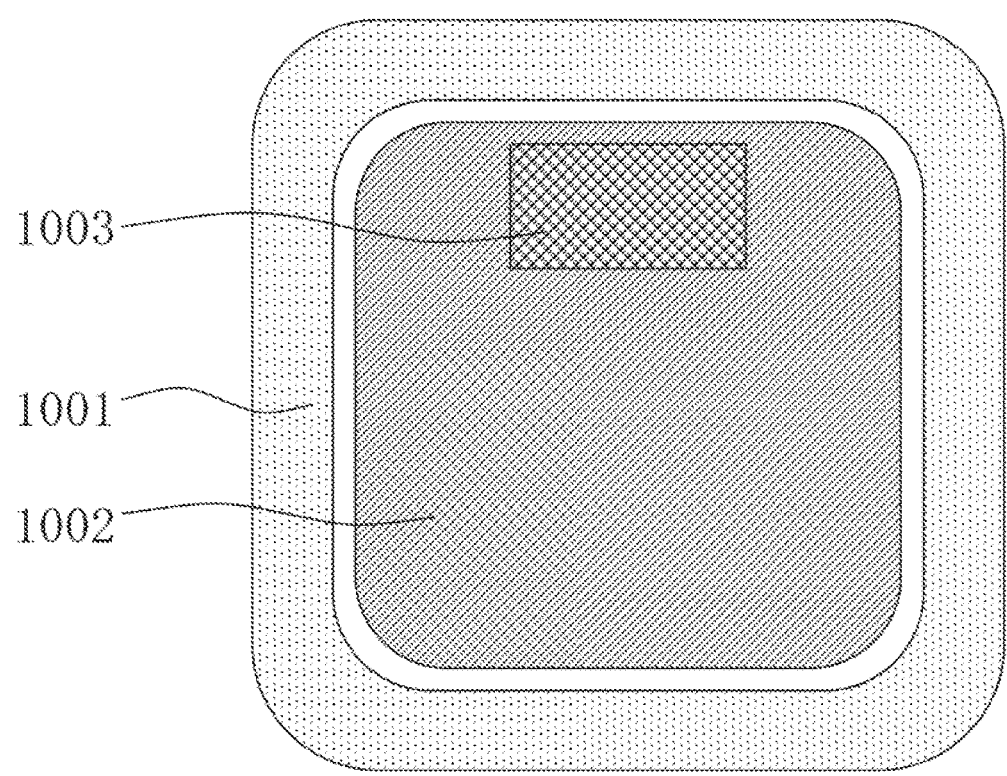
FIG. 1 is a schematic top plan view of a typical SiC power MOSFET chip.
Figure 2:
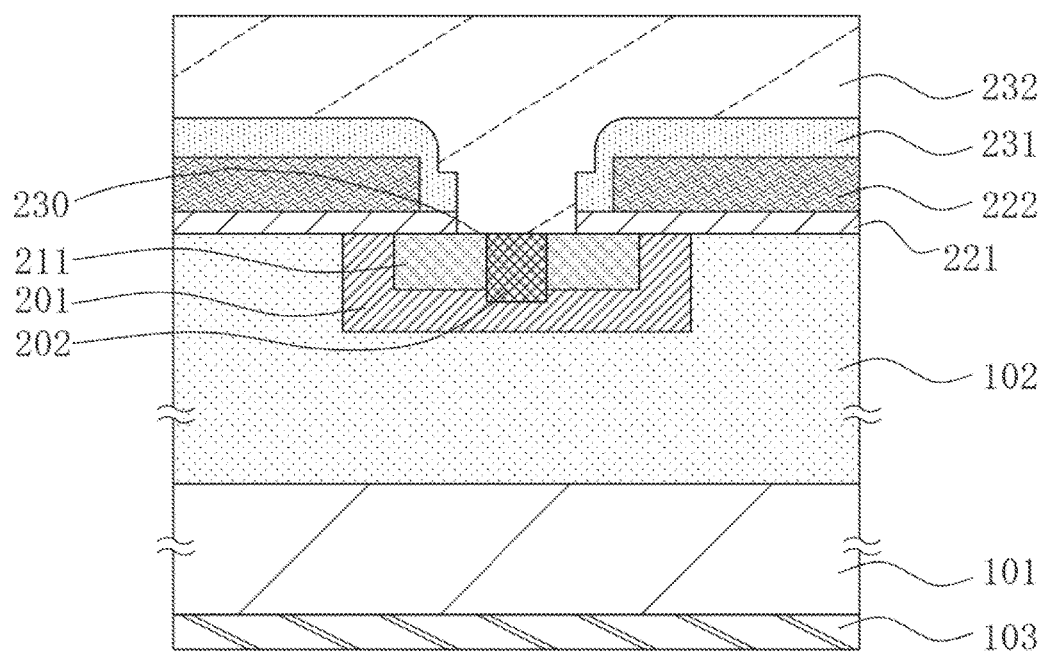
FIG. 2 is a major part sectional view of a unit cell of the typical SiC power MOSFET.

Some embodiments of the present disclosure will be described in detail below, referring to the drawings. Note that the present disclosure is not to be construed as limited to the contents of the descriptions of the following embodiments. It is easily understood by one skilled in the art that specific configurations of the present disclosure can be modified without departing from the thought or gist of the present disclosure.

In the configurations of the present disclosure described below, the parts having the same or equivalent functions are denoted by the same reference symbols commonly in the different drawings, and overlapping descriptions thereof may be omitted.

The expressions "first," "second," "third" and the like in the present specification and the like are used for identifying configurational components, and do not necessarily limit the number or order thereof. In addition, the numbers for identifying the configurational components are used on a context basis, and a number used in one context does not necessarily indicate the same configuration in other contexts. Besides, a configurational component identified by one number is not to be inhibited from functioning also as a configurational component identified by other number.

The position, size, shape, range and the like of each configuration shown in the drawings and the like may not represent an actual position, size, shape, range and the like, for the reason of treatments for easy understanding of the present disclosure. Accordingly, the present disclosure is not necessarily limited to the positions, sizes, shapes, ranges and the like disclosed in the drawings and the like.

A configurational component expressed in a singular form herein includes a plural form, unless clearly shown otherwise in a special context.

Embodiment 1

《1. Structure of Silicon Carbide Semiconductor Device According to Embodiment 1》

The structure of a silicon carbide semiconductor device according to Embodiment 1 of the present disclosure will be described below, referring to FIGS. 4 and 5A to 5D.

Figure 4:
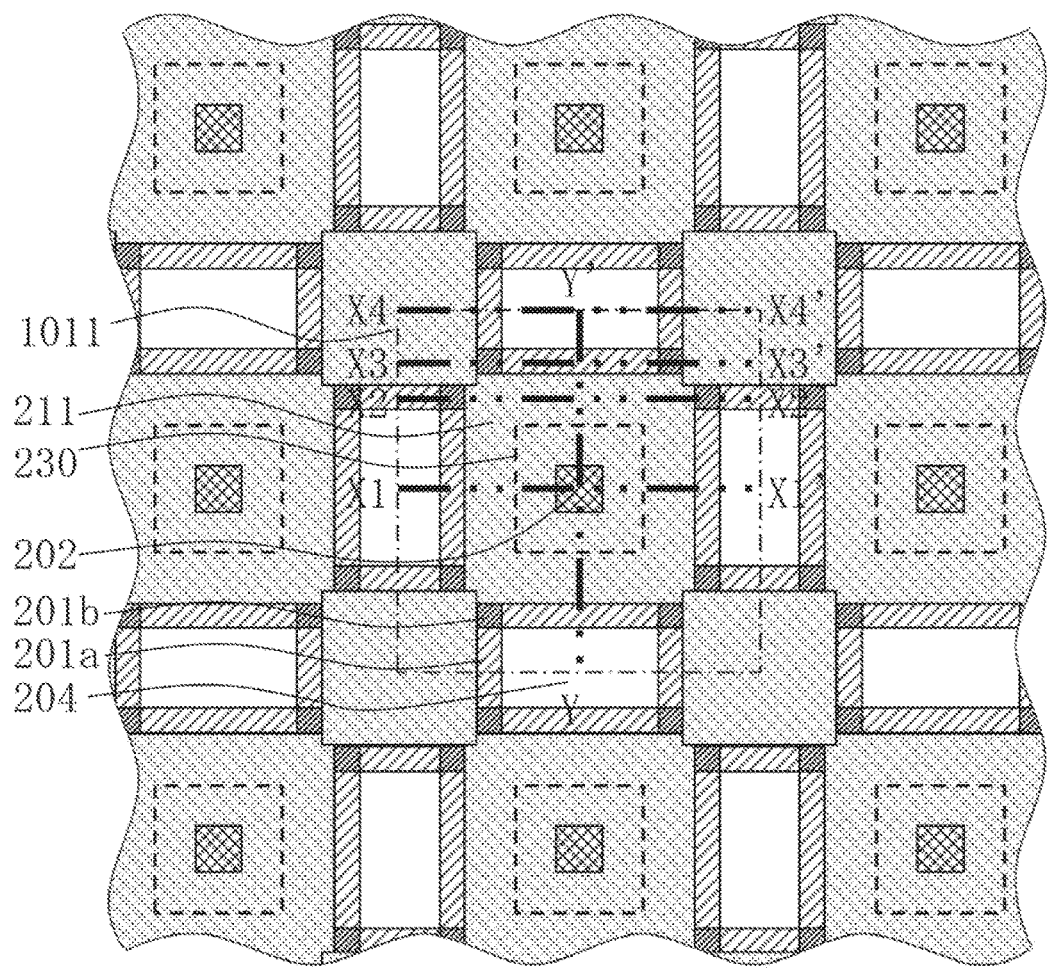
FIG. 4 is a top plan view showing a layout of unit cells of a SiC power MOSFET according to Embodiment 1 of the present disclosure.

FIG. 4 is a top plan view of a plurality of unit cells arranged in an active region of a SiC power MOSFET in the present disclosure.

FIGS. 5A to 5D are major part sectional views of the SiC power MOSFET. Sectional views taken along cutting plane lines X1-X1', X2-X2', X3-X3', and X4-X4' shown in FIG. 4 correspond to FIGS. 5A, 5B, 5C, and 5D, respectively. In addition, a terminal end region is provided on the outer side of an active region over which the unit cells are laid.

Figure 5A:
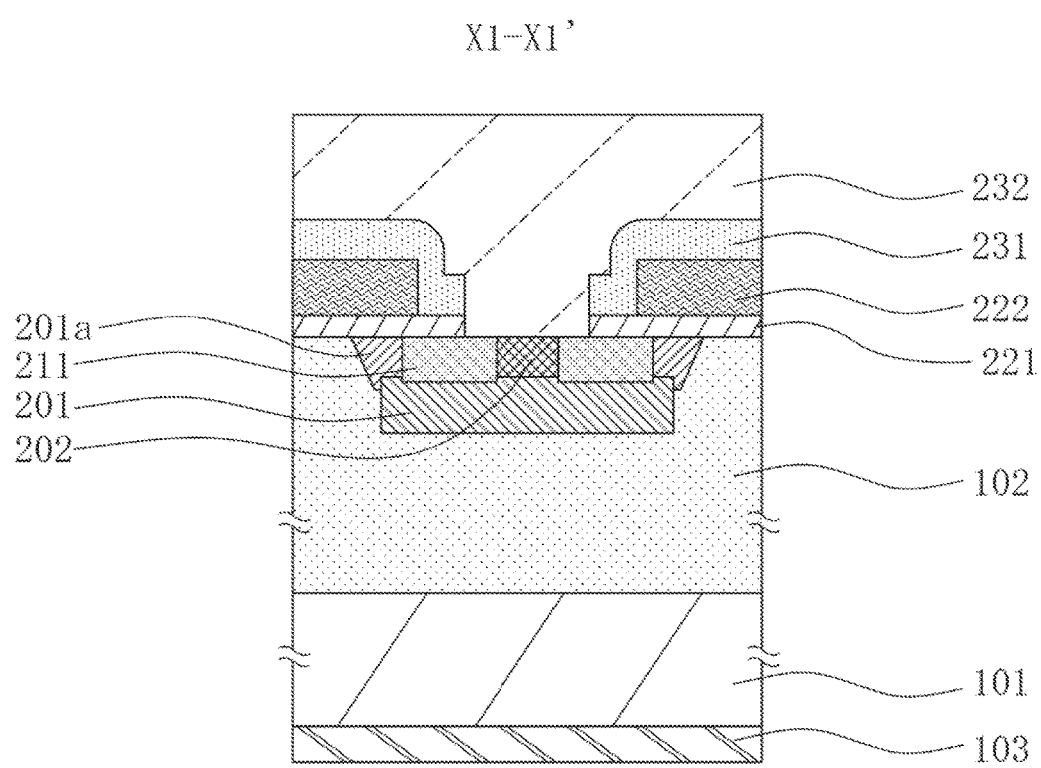
FIG. 5A is a sectional view of a unit cell in a cutting plane X1-X1', of the SiC power MOSFET according to Embodiment 1.

A sectional structure depicted in FIG. 5A will be described. An epitaxial layer 102 comprised of n-type SiC having a specific dopant concentration and a specific film thickness is provided on a major surface of an n⁺-type SiC substrate 101, a gate insulating film 221 is provided over part of a front surface of the epitaxial layer 102, and a gate electrode 222 is provided on the gate insulating film 221. Besides, a source electrode 232 is provided over part of the front surface of the epitaxial layer 102. In addition, a drain electrode 103 comprised of a metal is provided on a back surface of the SiC substrate 101.

A p-type channel region 201$a$ is formed in the vicinity of the front surface of the epitaxial layer 102. An n-type source region 211 and a p⁺-type body contact region 202 containing a p-type impurity at a higher concentration than that in a p-type body region 201 are formed in the inside of the p-type channel region 201$a$. The p-type body region 201 is formed on the lower side of the n-type source region 211 and the p⁺-type body contact region 202 at a position spaced apart from the front surface of the epitaxial layer 102, and is electrically connected to the source electrode 232 through the p⁺-type body contact region 202 which similarly has a p-type conductivity type. Unit cells 1011 are each substantially square in shape.

Figure 5B:
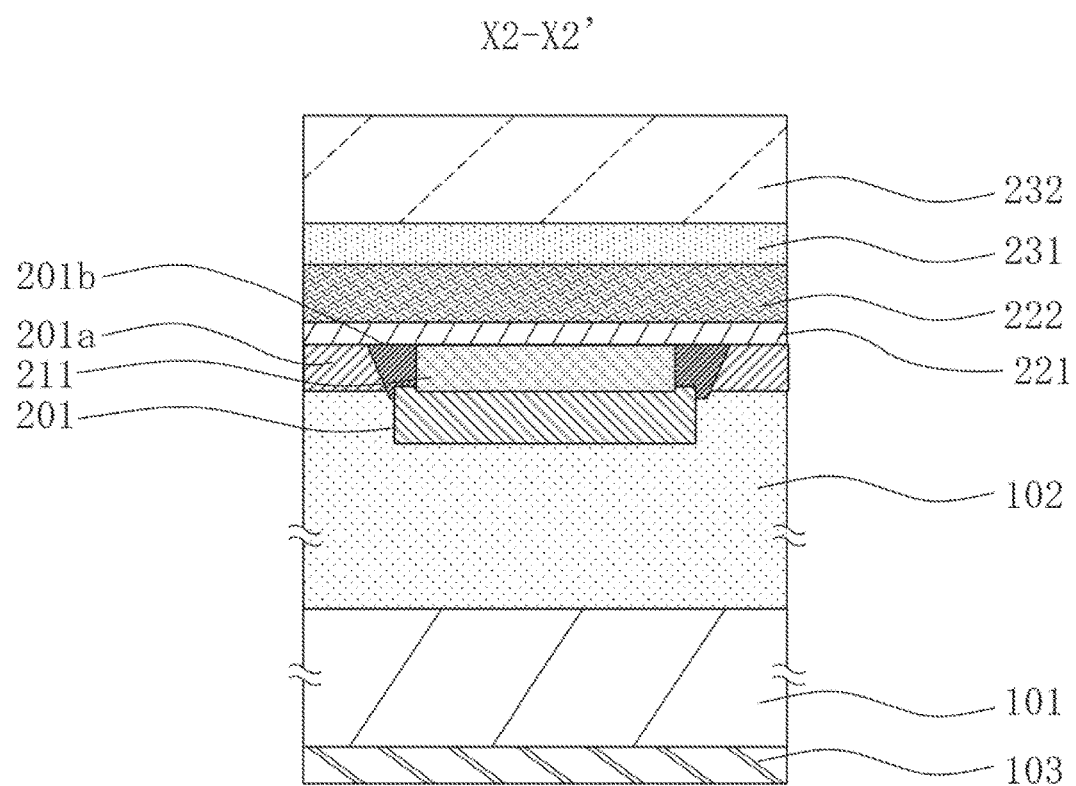
FIG. 5B is a sectional view of the unit cell in a cutting plane X2-X2', of the SiC power MOSFET according to Embodiment 1.
Figure 5C:
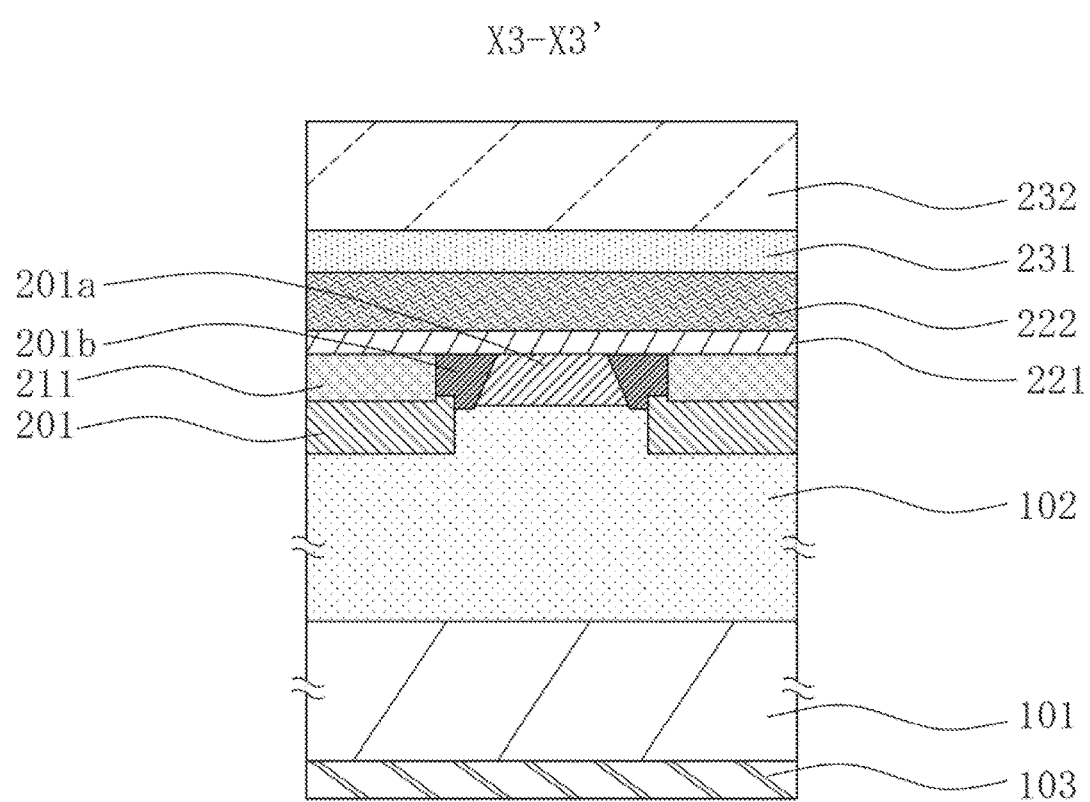
FIG. 5C is a sectional view of the unit cell in a cutting plane X3-X3', of the SiC power MOSFET according to Embodiment 1.
Figure 5D:
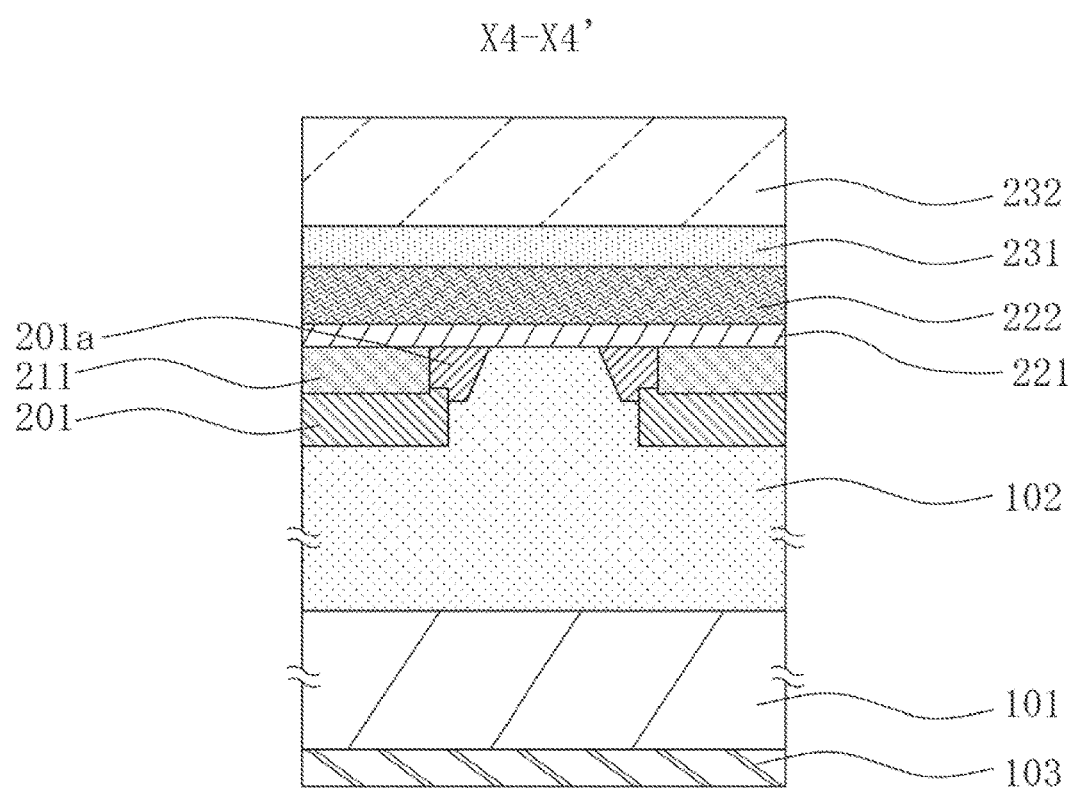
FIG. 5D is a sectional view of the unit cell in a cutting plane X4-X4', of the SiC power MOSFET according to Embodiment 1.

As shown in the top plan view in FIG. 4, the n-type source regions 211, the p-type channel regions 201$a$, 201$b$, and the p-type body regions 201 of the adjacent unit cells 1011 are not spaced from each other but are connected to each other. The channel regions 201$a$ and 201$b$ are provided in such a manner as to surround edge portions of the n-type source region 211, and the channel region is comprised of the first channel region 201$a$ having a low impurity concentration and the second channel region 201$b$ higher than the first channel region 201$a$ in impurity concentration. In addition, the first channel regions 201$a$ and the second channel regions 201$b$ are forming an outline portion of a closed region, and the inside of this closed region is a JFET region 204. FIGS. 5B, 5C, and 5D show sectional views taken along cutting plane lines. FIGS. 5B and 5C include both the first channel region 201$a$ and the second channel region 201$b$.

Here, the JFET region refers to an n-type region narrowly sandwiched between the p-type body regions 201 in a vertical MOSFET. Specifically, this is a portion where the n-type epitaxial layer 102 is left on the substrate, and where the concentration of an n-type impurity in the epitaxial layer 102 may be slightly raised. This is for the purpose of lowering resistance, in view of that this region is narrowly sandwiched and, therefore, a current flows therethrough with difficulty. On an operational basis, when a positive drain voltage is impressed, a depletion layer spreads toward the JFET region side. As depicted in FIG. 4, the JFET region 204 is surrounded by the channel regions 201$a$ and 201$b$ in this embodiment. Therefore, the channel width can be made to be long, which is advantageous from the viewpoint of lowering the resistance in a conduction state.

«2. Method of Manufacturing the Silicon Carbide Semiconductor Device According to Embodiment 1»

A method of manufacturing the silicon carbide semiconductor device according to Embodiment 1 of the present disclosure will be described in the order of steps, referring to FIGS. 6A to 10E. In the following description, the portions corresponding to the section of FIG. 5A will be mainly illustrated, and, when necessary, the sections corresponding to FIGS. 5B, 5C, and 5D and the top plan view corresponding to FIG. 4 will also be shown.

«2-1. Formation of Body Region»

Figure 6A:
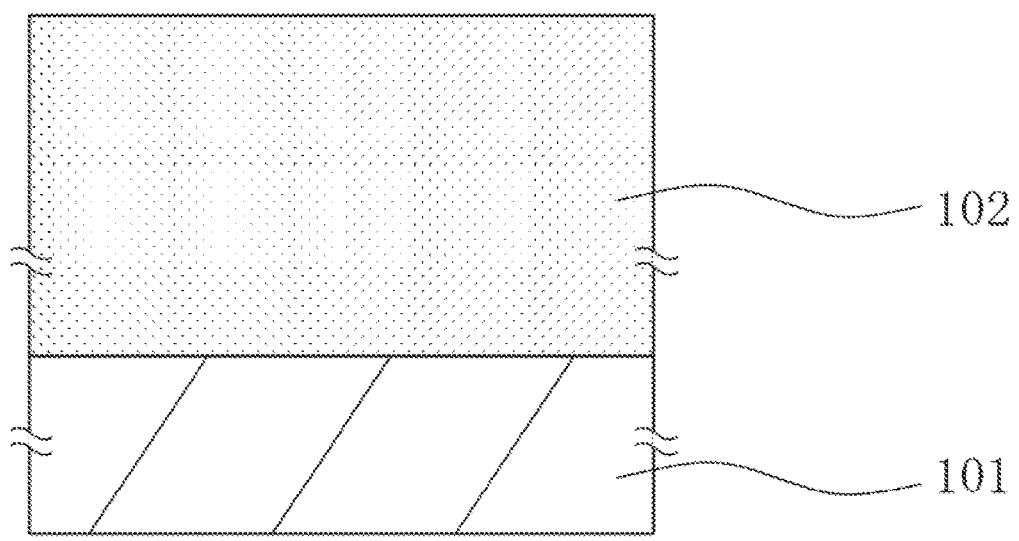
FIG. 6A is a sectional view of the unit cell in the cutting plane X1-X1', in a step of manufacture of the SiC power MOSFET according to Embodiment 1.

As shown in a sectional view in FIG. 6A, the epitaxial layer 102 comprised of SiC having an n⁻-type conductivity type is formed on the major surface of the n⁺-type 4H-SiC substrate 101. An n-type impurity has been introduced into the n⁺-type SiC substrate 101. The n-type impurity is, for example, nitrogen (N), and the impurity concentration of this n-type impurity is, for example, $1\times10^{18}$ to $1\times10^{21}$ cm⁻³.

The epitaxial layer 102 comprised of SiC can be formed on the front surface (first major surface) of the SiC substrate 101 by epitaxy, for example. The epitaxial layer 102 has a predetermined thickness and a predetermined dopant concentration which are determined according to the specifications of the device. The thickness of the epitaxial layer 102 is, for example, in the range of 3 to 30 μm. In addition, the n-type dopant added to the epitaxial layer 102 is, for example, nitrogen, and the dopant concentration is, for example, in the range of $1\times10^{14}$ to $1\times10^{17}$ cm⁻³.

Figure 6B:
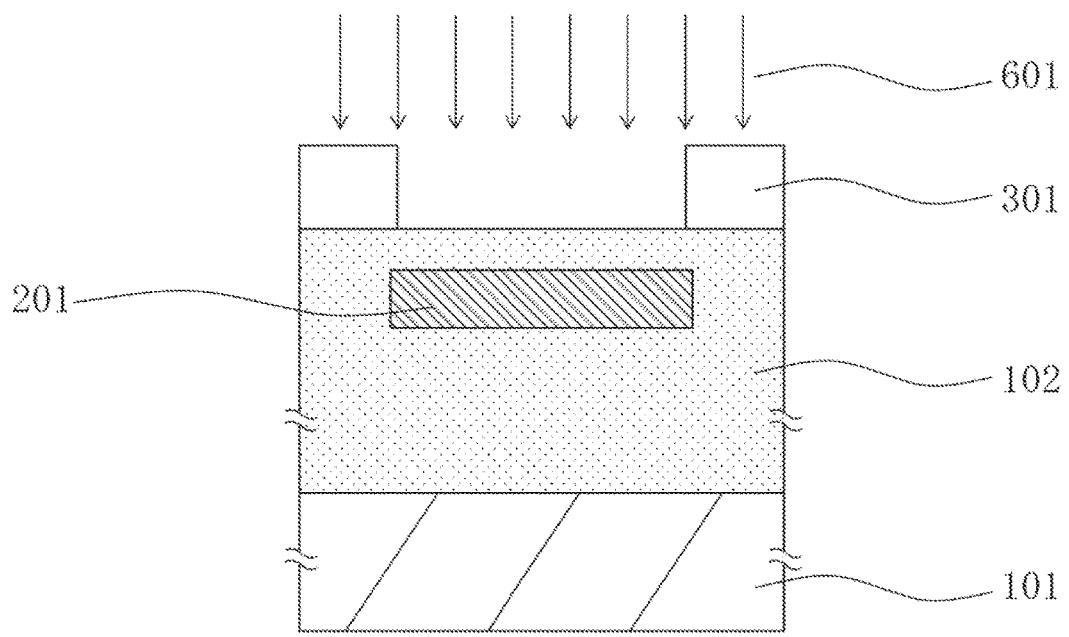
FIG. 6B is a sectional view of the unit cell in a cutting plane X1-X1', in a step subsequent to FIG. 6A of the manufacturing method of the SiC power MOSFET according to Embodiment 1.

As depicted in FIG. 6B, a mask material is deposited on the front surface of the n-type epitaxial layer 102, and patterning is conducted to form a mask 301, after which a p-type impurity 601 is implanted such that the p-type body region 201 is formed in the manner of being embedded in the epitaxial layer 102 at a position spaced apart from the front surface of the epitaxial layer 102.

In the case where a photoresist is used as the material for the mask 301, the mask can be formed by applying the photoresist and thereafter patterning the applied photoresist by a known lithographic method.

In the case where SiO₂ is used as the material for the mask 301, SiO₂ is deposited, after which a photoresist is further applied, and a resist pattern is formed by a known lithographic method. Further, with the resist pattern as an etching mask, SiO₂ is etched by, for example, a reactive ion etching method, after which the photoresist is removed, whereby the mask can be obtained. The thickness of the mask 301 is a thickness that is sufficient to shield implantation of ions, and may be, for example, 1.0 to 5.0 μm.

As the p-type impurity to be implanted, there can be used, for example, aluminum (Al) or boron (B). By this, the p-type body region 201 can be formed in a device formation region of the epitaxial layer 102. The depth of the bottom surface side end of the p-type body region 201 from the front surface of the epitaxial layer 102 may be, for example, about 0.5 to 2.0 μm. The depth of the front surface side end of the p-type body region 201 from the front surface of the epitaxial layer 102 is, for example, about 0.2 to 0.5 μm, and the concentration of the p-type impurity at the front surface is equal to or less than $1\times10^{17}$ cm³. Besides, the dopant concentration of the p-type body region 201 is, for example, in the range of $1\times10^{16}$ to $1\times10^{19}$ cm⁻³.

«2-2. Formation of Source Region»

Figure 7A:
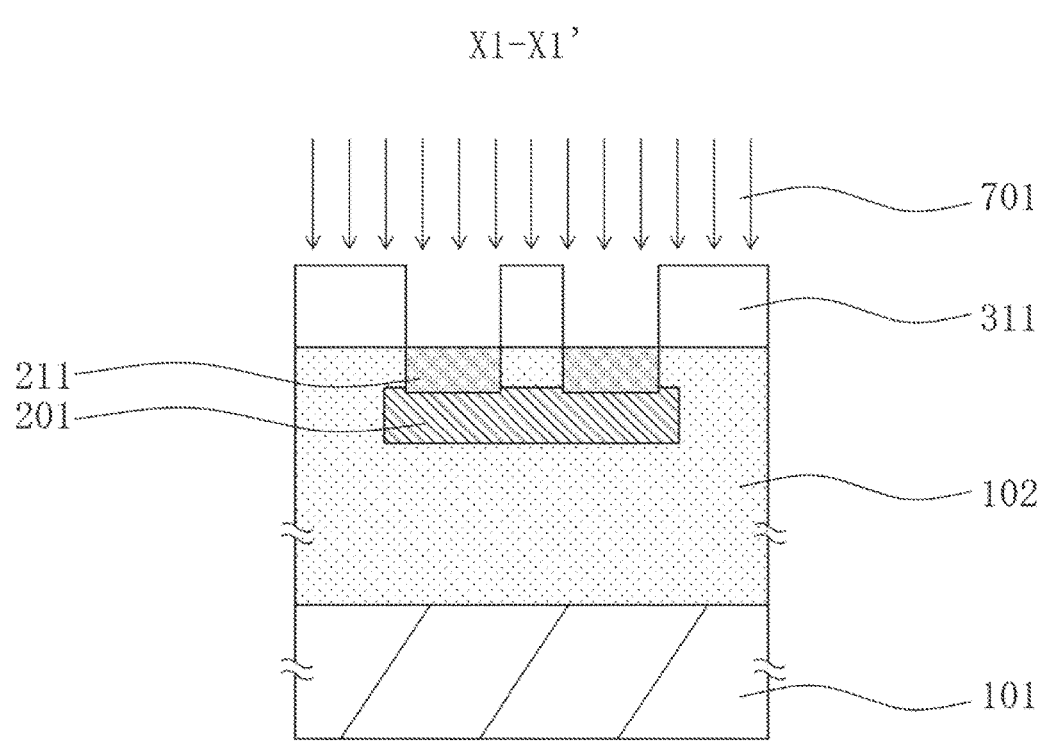
FIG. 7A is a sectional view of the unit cell in the sectional plane X1-X1', in a step subsequent to FIG. 6B of the manufacturing method of the SiC power MOSFET according to Embodiment 1.
Figure 7C:
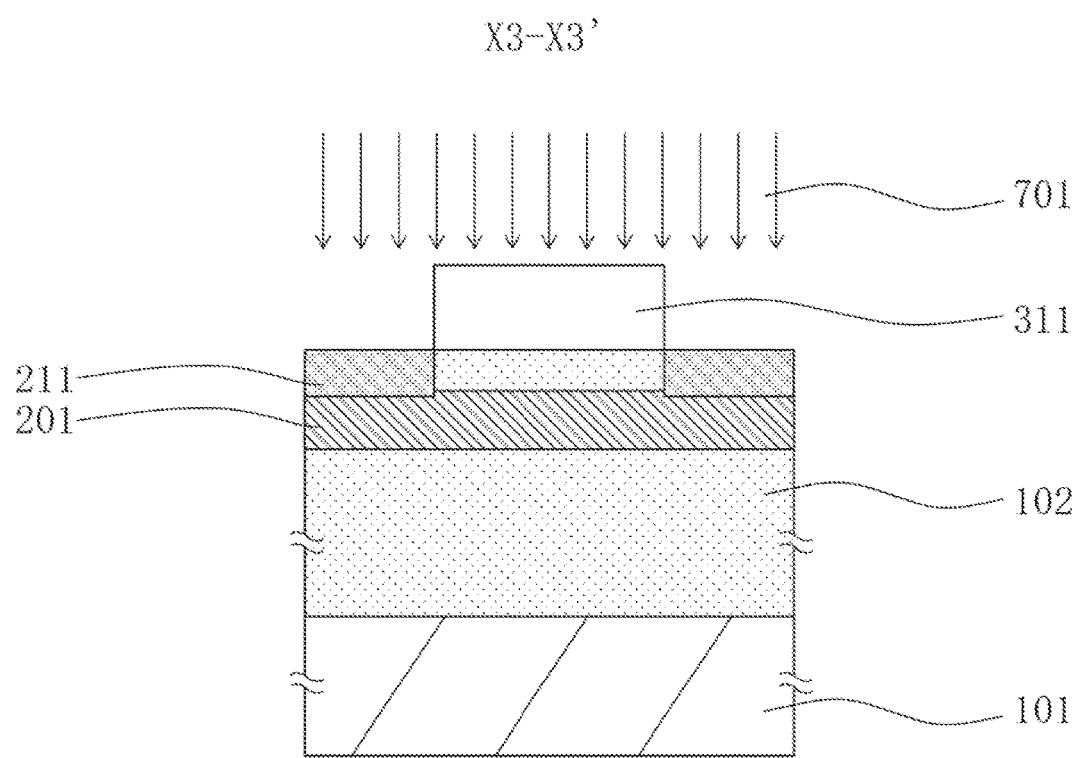
FIG. 7C is a sectional view of the unit cell in the sectional plane X3-X3', in a step subsequent to FIG. 6B of the manufacturing method of the SiC power MOSFET according to Embodiment 1.
Figure 7D:
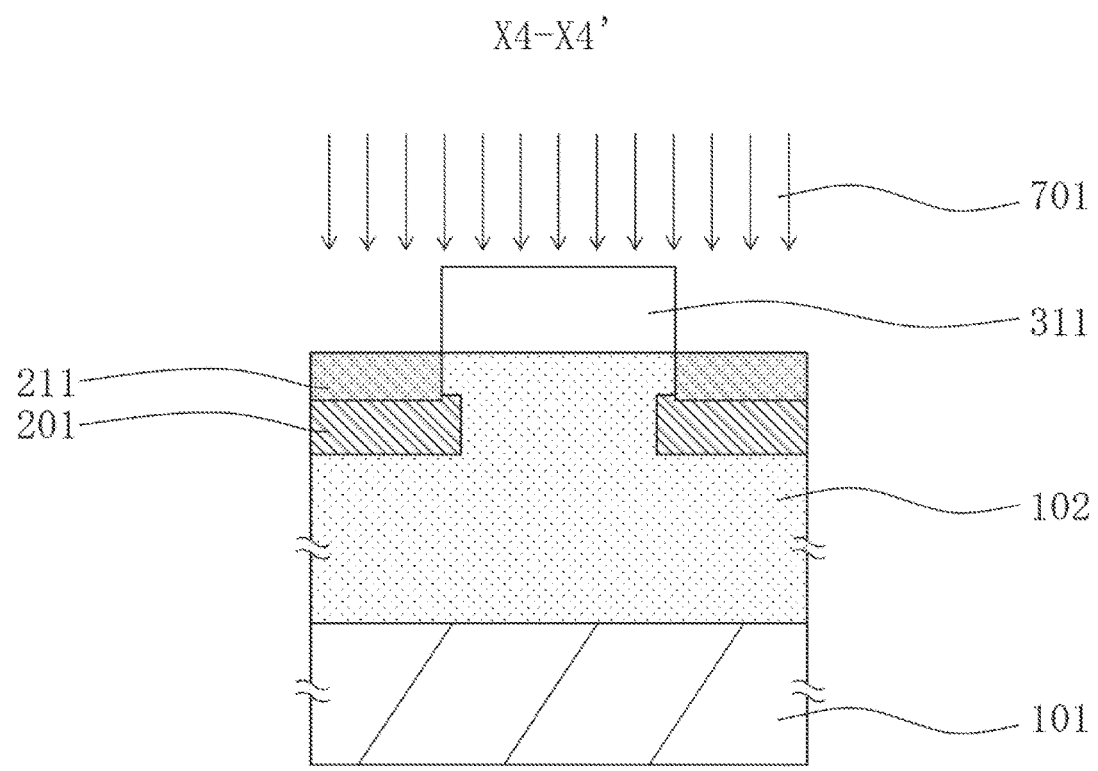
FIG. 7D is a sectional view of the unit cell in the sectional plane X4-X4', in a step subsequent to FIG. 6B of the manufacturing method of the SiC power MOSFET according to Embodiment 1.

As illustrated in FIG. 7A, next, after the mask 301 is removed, another mask 311 is further formed, and ions of an n-type impurity 701 are implanted, to form the n-type source region 211. As the n-type impurity, there can be used nitrogen (N) or phosphorus (P). The impurity concentration of the n-type source region 211 may be, for example, in the range of $1\times10^{17}$ to $1\times10^{21}$ cm⁻³. The depth of the n-type source region 211 from the front surface of the epitaxial layer 102 may be, for example, about 0.01 to 0.2 μm.

Figure 7E:
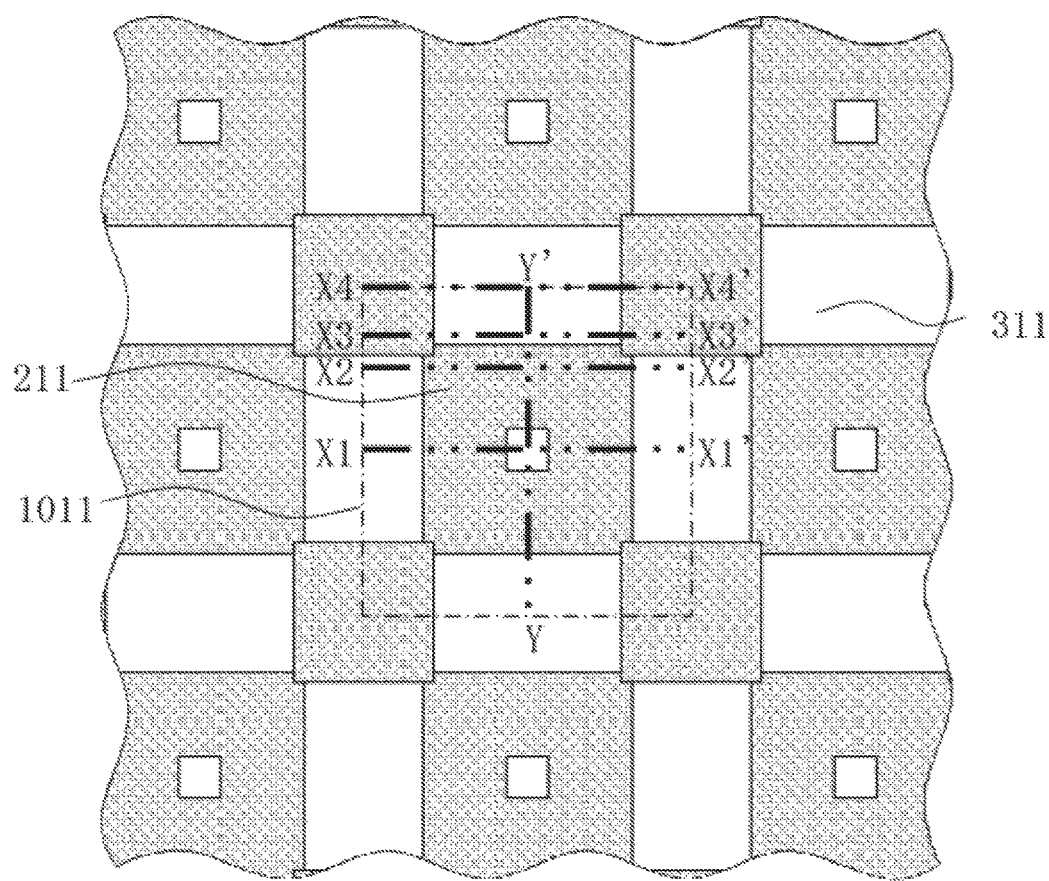
FIG. 7E is a top plan view showing a layout of the unit cells, in a step subsequent to FIG. 6B of the manufacturing method of the SiC power MOSFET according to Embodiment 1.

FIGS. 7B to 7E show a state at the time of the step of FIG. 7A. The top plan view is as shown in FIG. 7E. A portion covered with the mask 311 is seen, and the n-type source region 211 formed because of not being covered with the mask 311 is seen. Sectional views taken along cutting plane lines X1-X1', X2-X2', X3-X3', and X4-X4' shown in FIG. 7E are FIGS. 7A, 7B, 7C, and 7D, respectively. Since the p-type body region 201 is formed in the manner of being embedded in the epitaxial layer 102 at a position spaced apart from the front surface of the epitaxial layer 102, the p-type body region 201 is not illustrated in the top plan view.

«2-3. Formation of Channel Region»

Figure 8A:
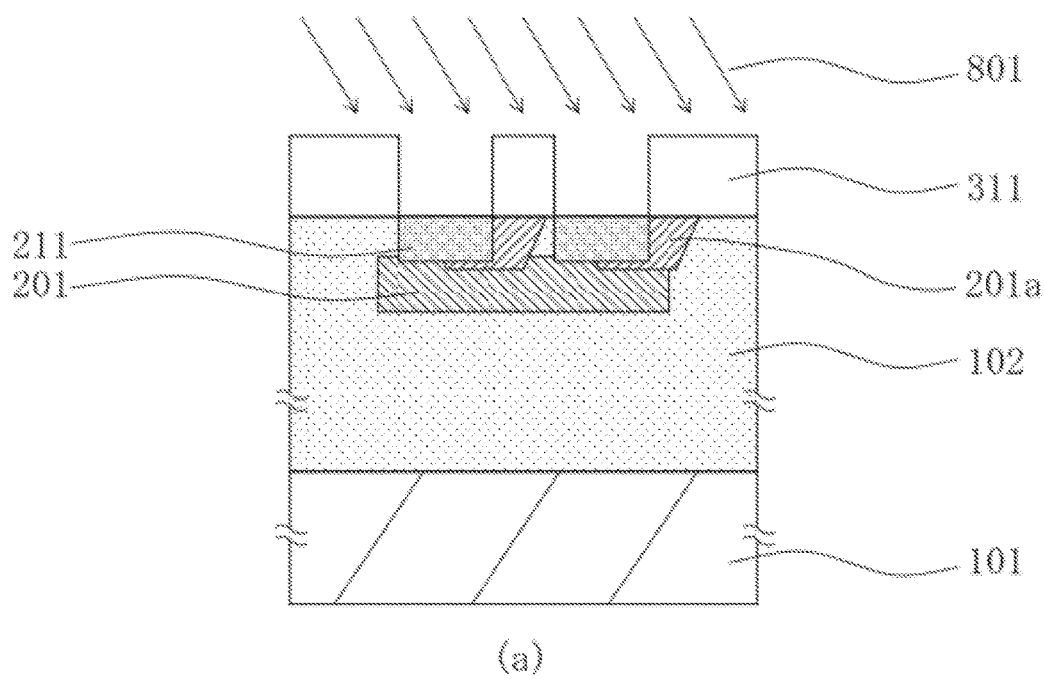
FIG. 8A is a sectional view of the unit cell in the cutting plane X1-X1', in a step subsequent to FIG. 7A of the manufacturing method of the SiC power MOSFET according to Embodiment 1.
Figure 8A:
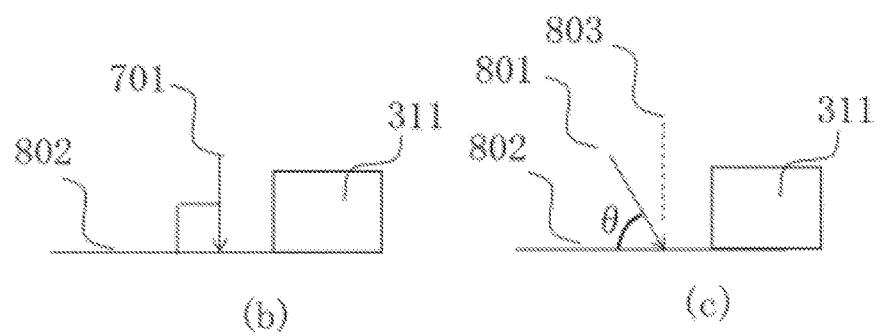

As illustrated in FIG. 8A(a), in a section X1-X1', while using the same mask 311 as in the step of FIG. 7, the p-type impurity 801 is implanted in a direction inclined toward X1 from the normal to the substrate surface. Specifically, in the step of FIG. 7, the n-type impurity 701 is implanted perpendicularly to a substrate surface 802 as depicted in FIG. 8A(b); on the other hand, in the step of FIG. 8A(a), the p-type impurity 801 is implanted at an acute angle θ in relation to the substrate surface 802 in the section X1-X1' as shown in FIG. 8A(c). Here, the angle θ is defined as an angle on the side opposite to the mask 311, selected from among the angles formed between the implantation direction of the p-type impurity 801 and the substrate surface 802. This ensures that the p-type impurity 801 enters into part of the portion shielded by the mask 311, to form a p-type channel region (first channel region) 201a. Here, in the channel implantation step, the inclination angle formed between the implantation direction and the normal to the semiconductor substrate is set to be 15 to 45 degrees. In other words, θ is 45 to 75 degrees.

Figure 8B:
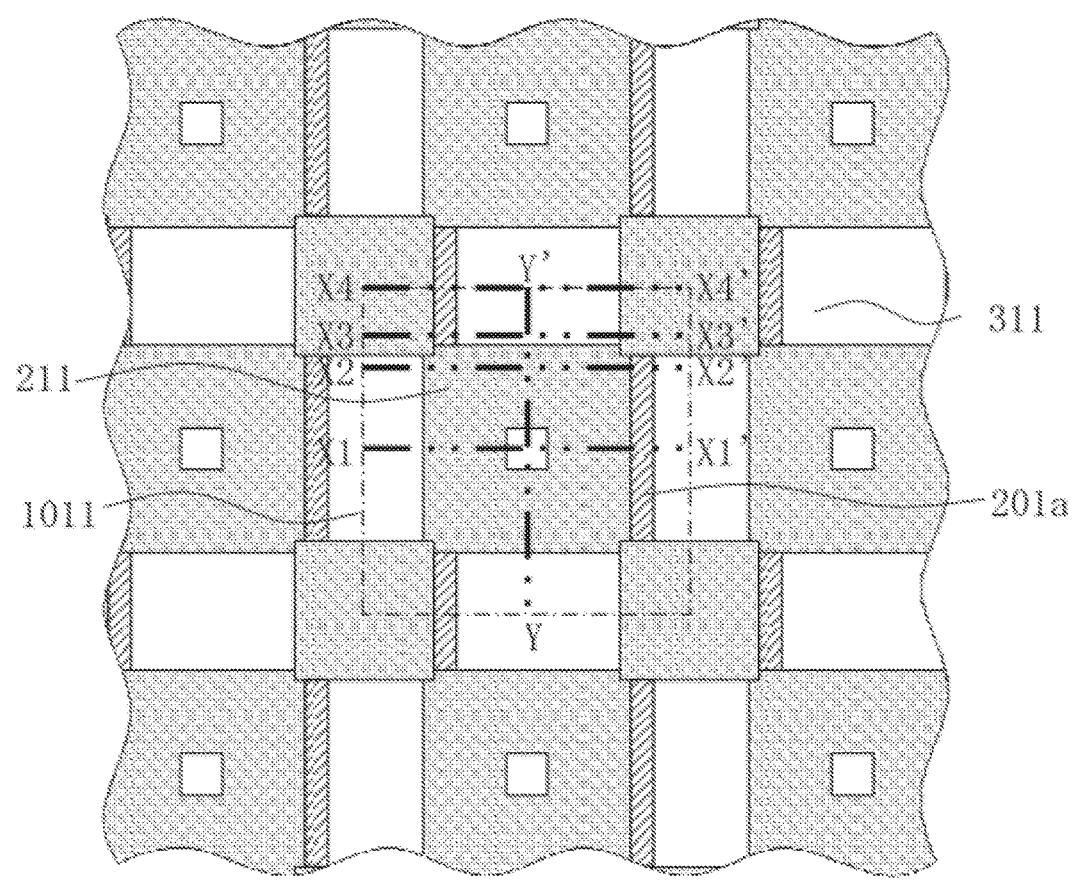
FIG. 8B is a top plan view showing a layout of the unit cells, in a step subsequent to FIG. 7E of the manufacturing method of the SiC power MOSFET according to Embodiment 1.

FIG. 8B is a plan view showing the results of the impurity implantation of FIG. 8A. As depicted in FIG. 8B, the first channel region 201a is formed in the vertical direction on the paper surface, along one of the edges of the n-type source region 211. The first channel region 201a is formed under the mask 311.

As the p-type impurity to be implanted, there can be used, for example, aluminum (Al) or boron (B). The inclination angle of implantation may be 15 to 45 degrees. Besides, in order to cause the impurity to reach the epitaxial layer 102 through the mask, the acceleration energy for implantation is desirably 300 to 1,500 keV at a maximum.

Next, the p-type impurity is implanted in a direction inclined toward Y from the normal to the substrate surface, at the same inclination angle as above.

Figure 8C:
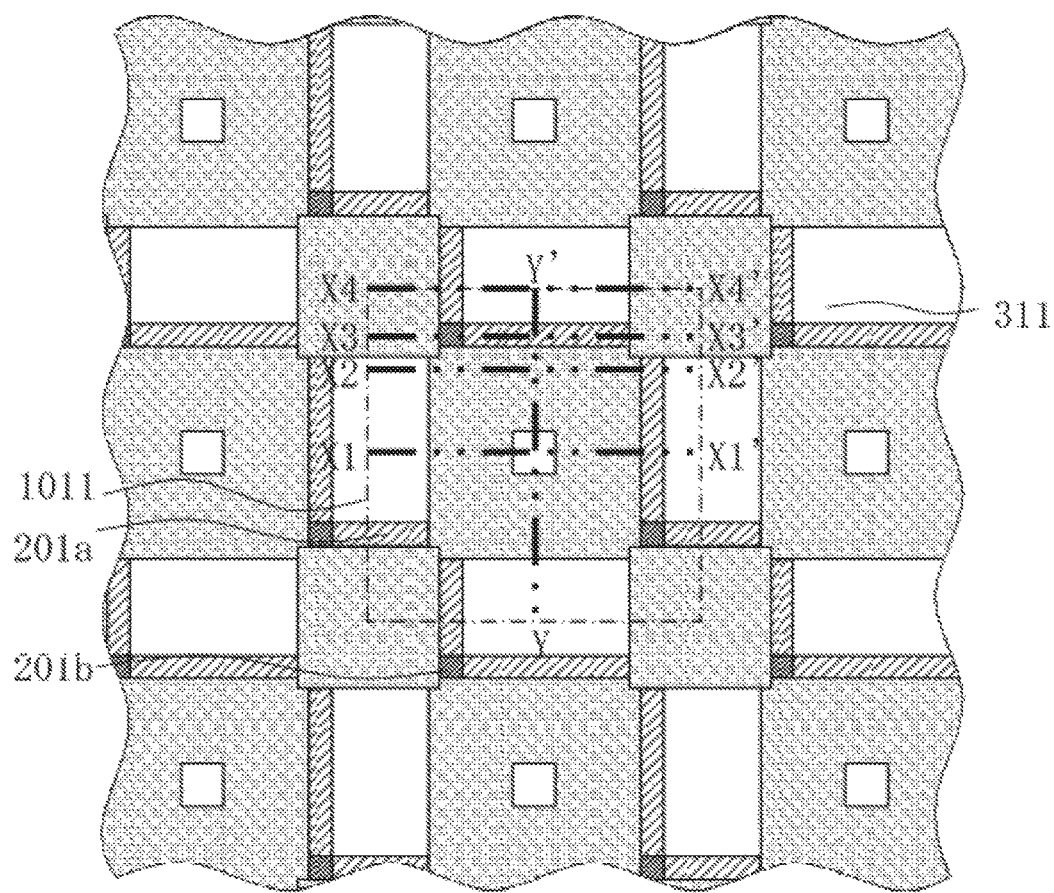
FIG. 8C is a top plan view showing a layout of the unit cells, in a step subsequent to FIG. 8B of the manufacturing method of the SiC power MOSFET according to Embodiment 1.

FIG. 8C depicts the results of the p-type impurity implantation. By this implantation, the first channel region 201a is newly formed under the mask 311 in the horizontal direction on the paper surface, along another one of the edges of the n-type source region 211; in addition, the impurity is implanted also to part of the first channel region 201a already formed in FIG. 8B, in an overlapping manner, to form the second channel region 201b having a higher concentration.

Figure 8D:
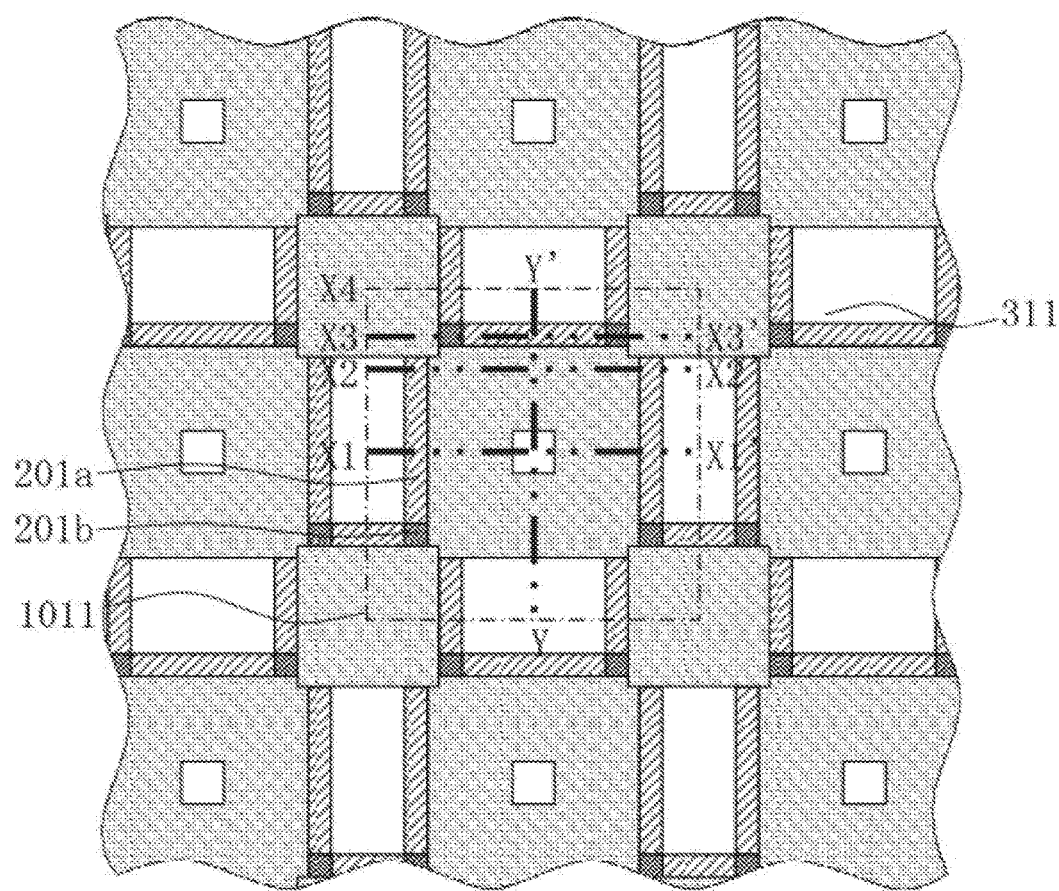
FIG. 8D is a top plan view showing a layout of the unit cells, in a step subsequent to FIG. 8C of the manufacturing method of the SiC power MOSFET according to Embodiment 1.
Figure 8E:
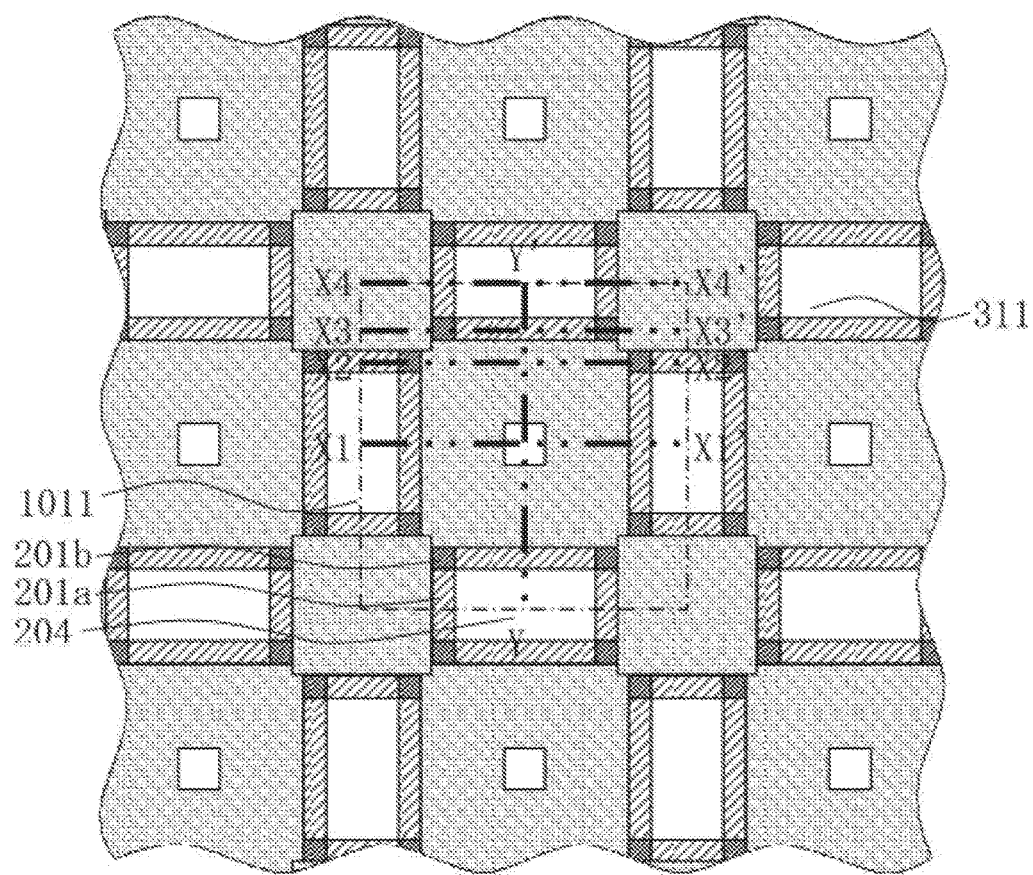
FIG. 8E is a top plan view showing a layout of the unit cells, in a step subsequent to FIG. 8D of the manufacturing method of the SiC power MOSFET according to Embodiment 1.

FIGS. 8D and 8E show changes by the subsequent steps. Subsequently to the above, the p-type impurity is implanted in a direction inclined toward X1' from the normal to the substrate surface, at the same inclination angle as above, resulting in the state of FIG. 8D. Further, subsequently, the p-type impurity is implanted in a direction inclined toward Y' from the normal to the substrate surface, at the same inclination angle as above, resulting in the state of FIG. 8E.

FIGS. 9A to 9D show sectional views taken along cutting plane lines of FIG. 8E. The sectional views taken along the cutting plane lines X1-X1', X2-X2', X3-X3', and X4-X4' shown in FIG. 8E are FIGS. 9A to 9D, respectively. In the second and latter ion implantation steps, some parts are subjected to ion implantation in the manner of overlapping with part of the first channel region 201a already formed, to be the second channel regions 201b having a higher impurity concentration. As a result, the impurity concentration of the second channel region 201b is about 1.6 to 2.5 times the impurity concentration of the first channel region 201a.

In the four implantation steps, only the direction of inclination is different, and the other conditions such as inclination angle, the kind of implanted ions, acceleration energy, and dose may be the same. It is noted here, however, that in the case where the implantation depth differs depending on the crystal orientation of the substrate surface, the implantation conditions such as inclination angle may be appropriately changed according to the direction, whereby the results of implantations can be controlled such that the lengths and impurity concentrations of the channels formed in the four directions will be the same. By the above steps, the source regions and the channel regions are formed over the substrate surface.

«2-4. Formation of Body Contact Region»

Next, after the mask 311 is removed, another mask 321 is formed, ions of the p-type impurity 1101 are implanted using the mask 321 as a shielding film, to form the $p^+$-type body contact region 202.

Figure 9A:
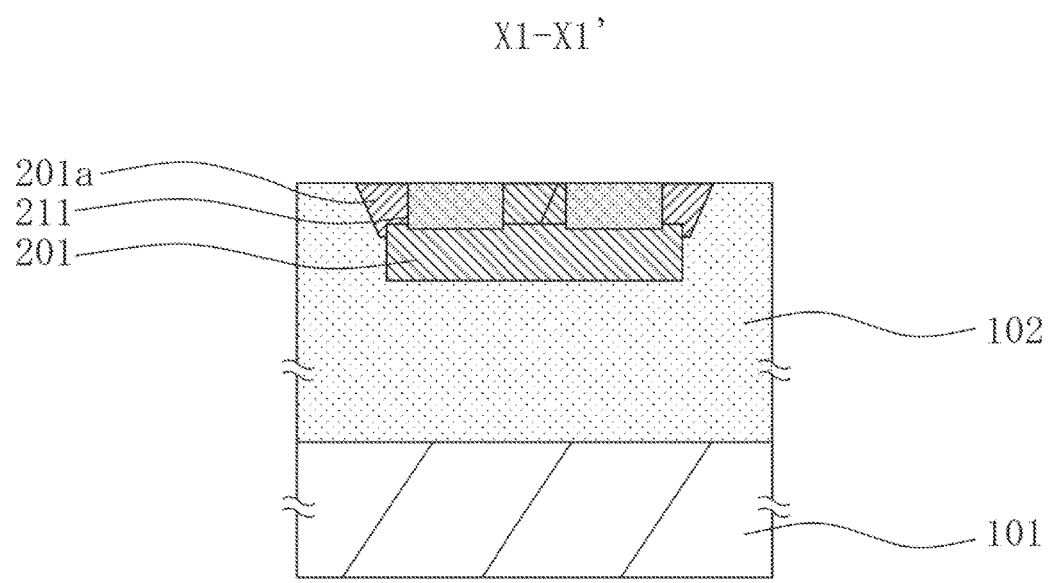
FIG. 9A is a sectional view of the unit cell in the cutting plane X1-X1', in the step subsequent to FIG. 8D of the manufacturing method of the SiC power MOSFET according to Embodiment 1.
Figure 9B:
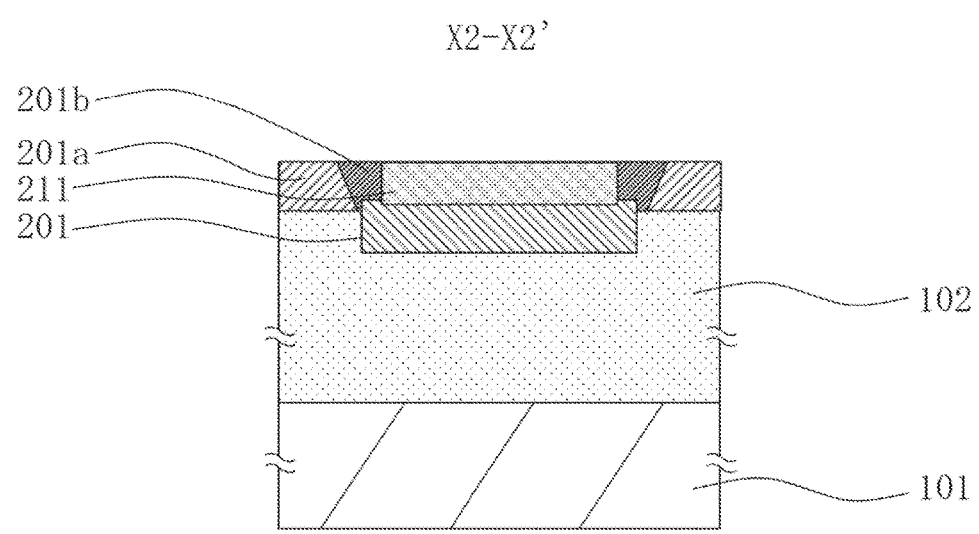
FIG. 9B is a sectional view of the unit cell in the cutting plane X2-X2', in the step subsequent to FIG. 8D of the manufacturing method of the SiC power MOSFET according to Embodiment 1.
Figure 9C:
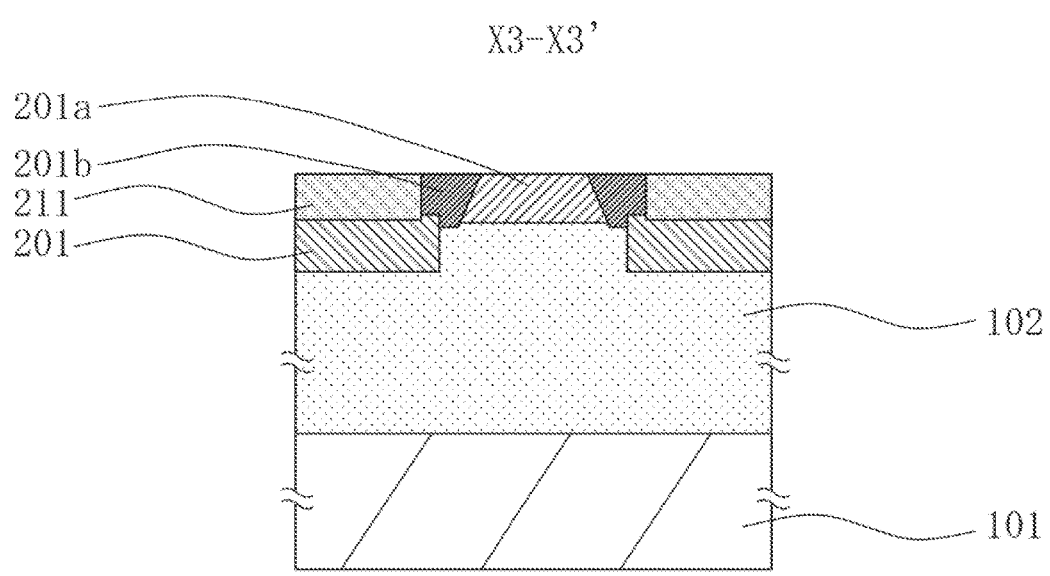
FIG. 9C is a sectional view of the unit cell in the cutting plane X3-X3', in the step subsequent to FIG. 8D of the manufacturing method of the SiC power MOSFET according to Embodiment 1.
Figure 9D:
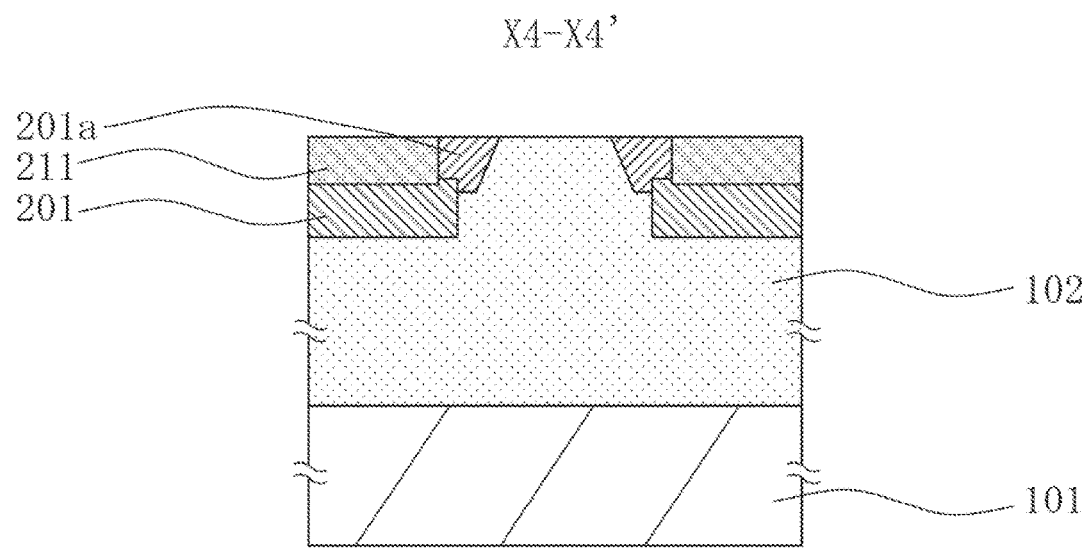
FIG. 9D is a sectional view of the unit cell in the cutting plane X4-X4', in the step subsequent to FIG. 8D of the manufacturing method of the SiC power MOSFET according to Embodiment 1.
Figure 10A:
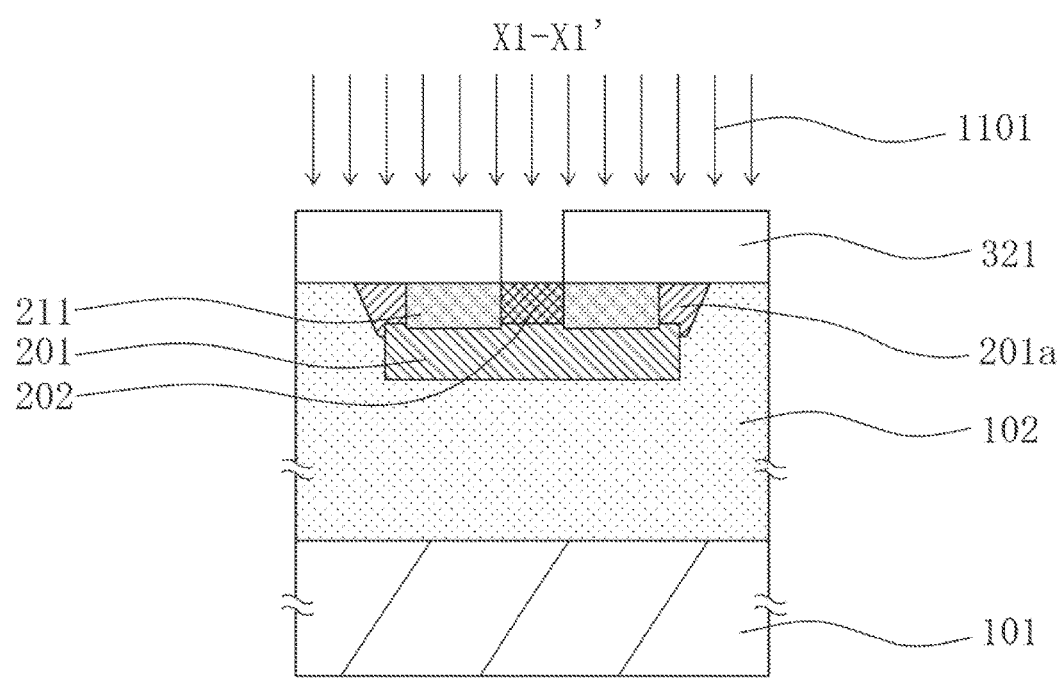
FIG. 10A is a sectional view of the unit cell in the cutting plane X1-X1', in a step subsequent to FIG. 9A of the manufacturing method of the SiC power MOSFET according to Embodiment 1.

FIG. 10A shows the manner when the $p^+$-type body contact region 202 is formed, in the sectional view along X1-X1' of FIG. 9A. The $p^+$-type body contact region 202 is formed in contact with an inside side surface of the n-type source region 211. As the p-type impurity, there can be used aluminum (Al) or boron (B). The impurity concentration of the $p^+$-type body contact region 202 is, for example, in the range of $1 \times 10^{19}$ to $1 \times 10^{21}$ $cm^{-3}$. The depth of the $p^+$-type body contact region 202 from the front surface of the epitaxial layer 102 is, for example, about 0.1 to 0.4 μm.

Figure 10B:
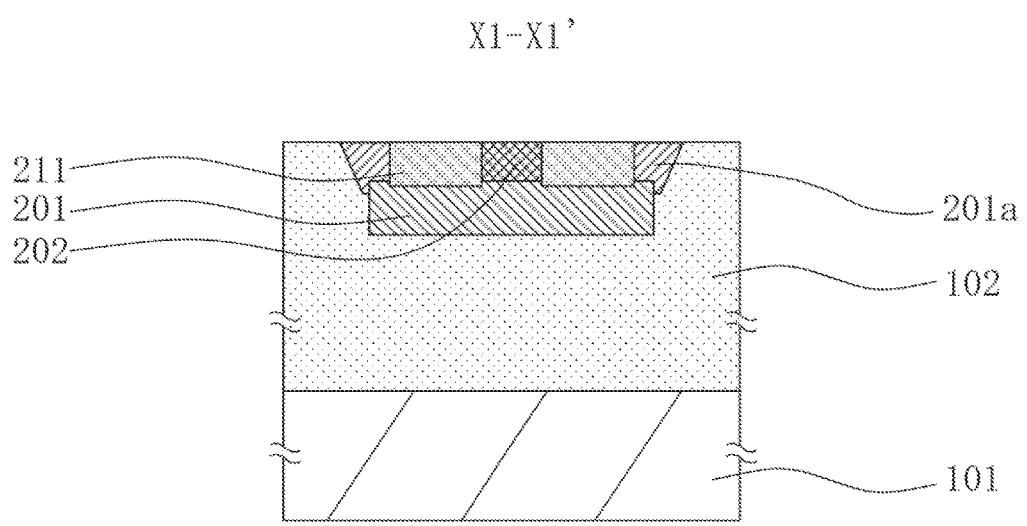
FIG. 10B is a sectional view of the unit cell in the cutting plane X1-X1', in a step subsequent to FIG. 10A of the manufacturing method of the SiC power MOSFET according to Embodiment 1.

After the mask 321 of FIG. 10A is removed, as shown in FIG. 10B, a heat treatment is conducted, whereby the ion-implanted impurity is activated. Though omitted in the figure, surface coating films comprised of carbon (C) having a thickness of, for example, about 0.05 μm may be formed on the front surface of the epitaxial layer 102 and the back surface of the SiC substrate before the activating heat treatment. This surface coating films have an effect of preventing the front surface of the epitaxial layer 102 and the back surface of the SiC substrate from being roughened at the time of the activating heat treatment. After the activating heat treatment, the surface coating films are removed by, for example, an oxygen plasma treatment.

«2-5. Formation of Electrode, and Others»

Figure 10C:
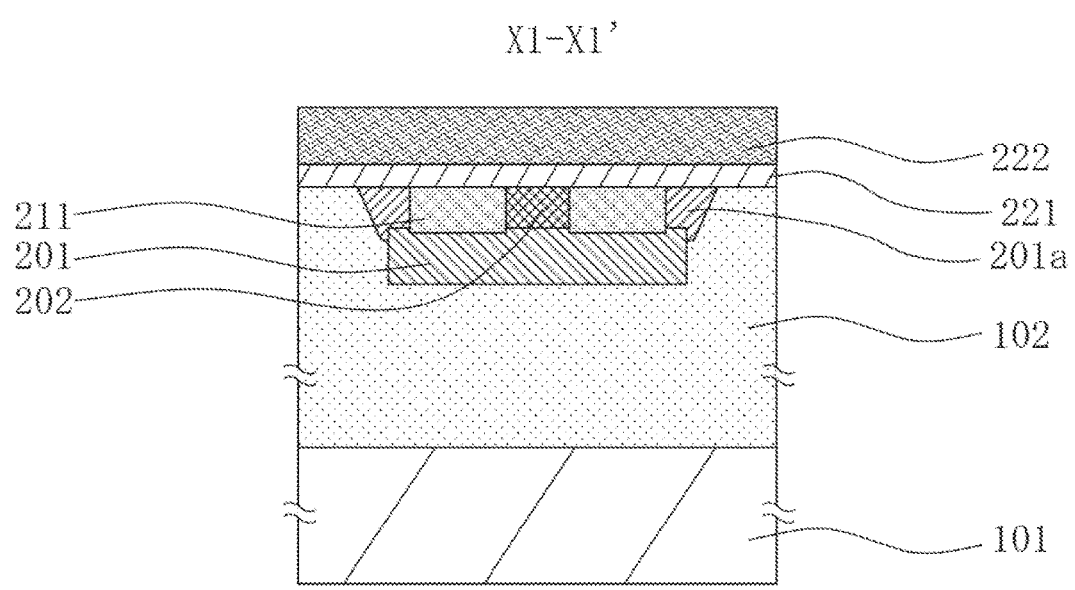
FIG. 10C is a sectional view of the unit cell in the cutting plane X1-X1', in a step subsequent to FIG. 10B of the manufacturing method of the SiC power MOSFET according to Embodiment 1.
Figure 10D:
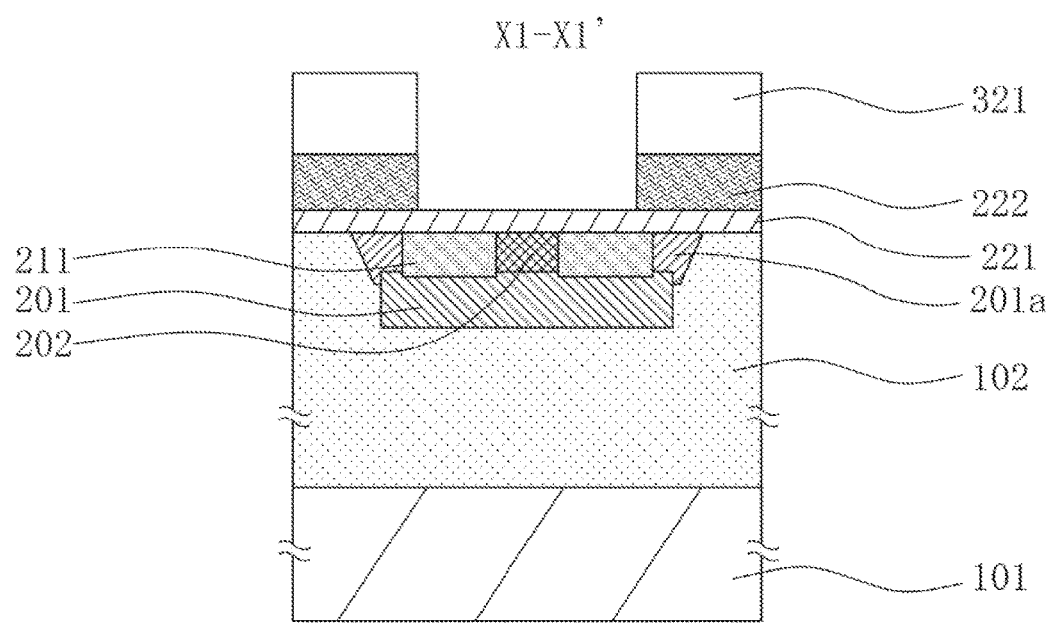
FIG. 10D is a sectional view of the unit cell in the cutting plane X1-X1', in a step subsequent to FIG. 10C of the manufacturing method of the SiC power MOSFET according to Embodiment 1.
Figure 10E:
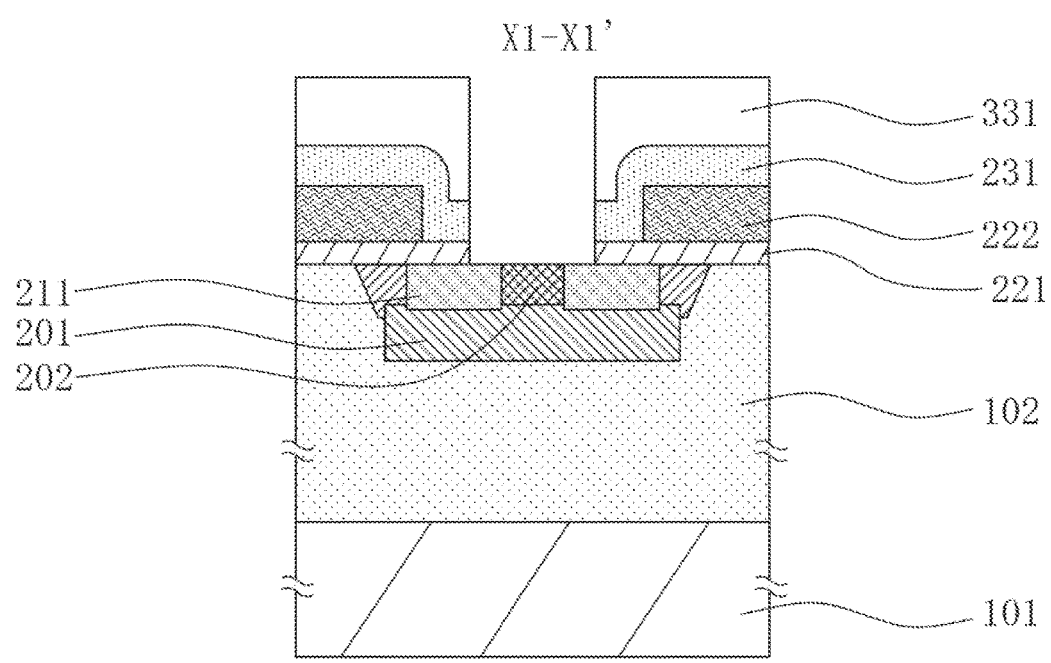
FIG. 10E is a sectional view of the unit cell in the cutting plane X1-X1', in a step subsequent to FIG. 10D of the manufacturing method of the SiC power MOSFET according to Embodiment 1.

Referring to FIGS. 10C to 10E, the subsequent steps in the X1-X1' sectional view of FIG. 10B will be described.

As depicted in FIG. 10C, the gate insulating film 221 and the gate electrode film 222 doped with the n-type impurity are formed over the front surface of the epitaxial layer 102. The gate insulating film 221 is comprised of a silicon dioxide ($SiO_2$) film formed by a thermal chemical vapor deposition (CVD) method, for example. The thickness of the gate insulating film 221 may be, for example, 0.02 to 0.2 μm. The gate electrode film 222 is comprised of, for example, an n-type polycrystalline silicon film, which can be formed by a thermal CVD method. The thickness of the gate electrode film 222 is, for example, about 0.2 to 0.5 μm. In addition, the polycrystalline silicon may be deposited in a polycrystalline state, or may be deposited in an amorphous state and thereafter converted to be polycrystalline by a heat treatment.

As shown in FIG. 10D, a mask 321 is formed, and the gate electrode 222 is processed by a dry etching method.

Subsequently, the mask 321 is removed, after which the interlayer insulating film 231 is formed, for example by a plasma CVD method, in such a manner as to cover the gate electrode 222 and the gate insulating film 221. Further, using a mask 331, the interlayer insulating film 231 and the gate insulating film 221 are processed by dry etching, to form a contact hole that reaches part of the front surface of the n-type source region 211 and the front surface of the p$^+$-type body contact region 202.

FIG. 10E shows the state upon the formation of the contact hole. Next, though omitted in the drawing, another mask is formed, and the interlayer insulating film 231 is processed by dry etching, to form a contact hole that reaches the upper surface of the gate electrode 222.

Subsequently, a metallic film, for example, a stacked film comprised of a titanium (Ti) film, a titanium nitride (TiN) film and an aluminum (Al) film is build up over the contact hole formed on the surface of part of the n-type source region 211 and the surface of the p$^+$-type body contact region 202, and the interlayer insulating film 231 provided with the opening portion (omitted in the drawing) reaching the gate electrode 222.

Subsequently, the metallic film is processed, to form the source electrode 232 that is electrically connected to part of the n-type source region 211 and the p$^+$-type body contact region 202, and a gate wiring electrode (omitted in the drawing) that is electrically connected to the gate electrode 222. Thereafter, external wirings are electrically connected to the source electrode 232 and the gate wiring electrode (omitted in the drawing).

Though description is omitted, the drain electrode 103 comprised of a metal is formed over the back surface of the SiC substrate 101. In addition, for electrical connection between the drain electrode 103 and the back surface of the SiC substrate 101, a region in which an n-type impurity is implanted at a high concentration and a silicide layer may be formed over the back surface of the SiC substrate.

By the above steps, the structure of the MOSFET as shown in FIGS. 5A to 5D can be obtained.

Embodiment 2

Figure 11:
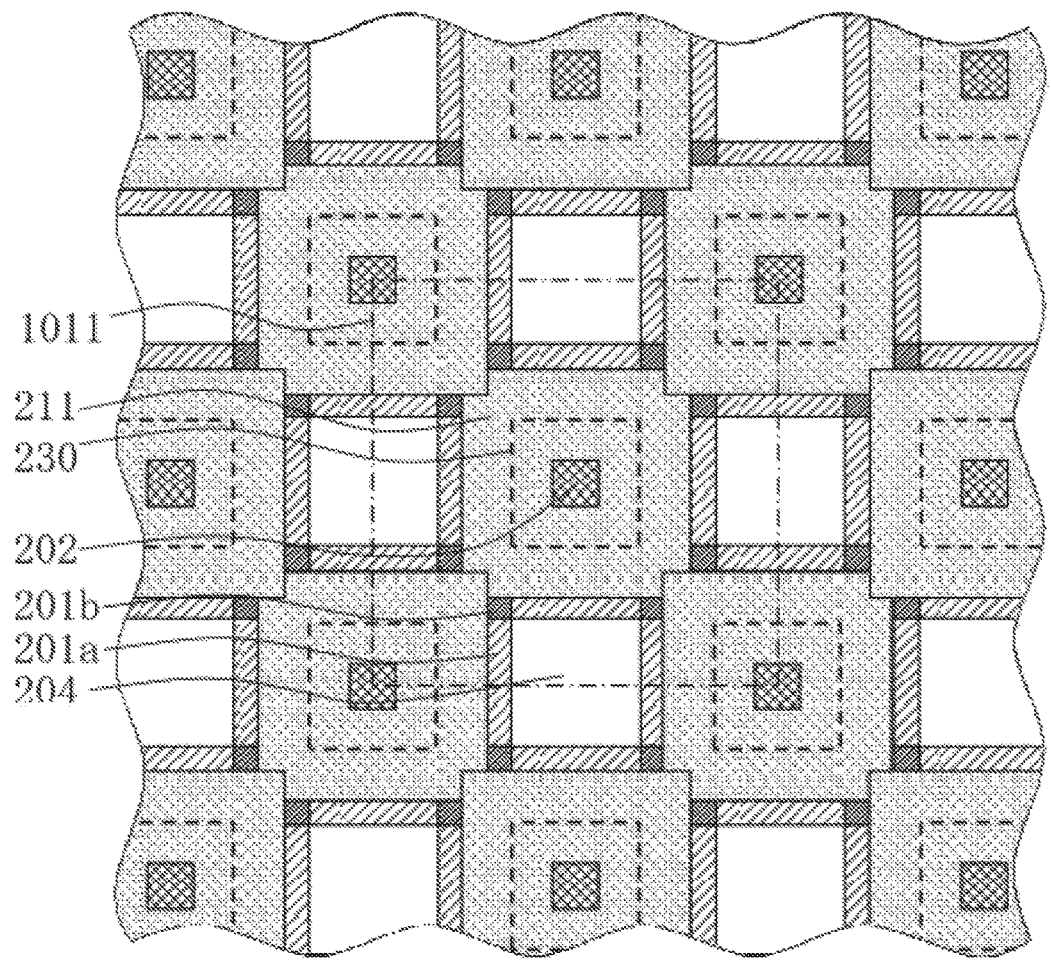
FIG. 11 is a top plan view showing a layout of unit cells of a SiC power MOSFET according to Embodiment 2 of the present disclosure.

FIG. 11 shows a top plan view of unit cells of a SiC MOSFET according to a second embodiment of the present disclosure. Embodiment 2 differs from Embodiment 1 in that the JFET region 204 is formed in a square shape, and a source contact region 230 is formed in the n-type source region 211 formed on the outside on the four sides of the JFET region 204. In other words, the n-type source regions 211 each including the source contact region 230 are arranged in a checkerboard-like pattern such that corners of the n-type source regions 211 overlap on one another.

On the outside of the square JFET region 204, there are formed the first channel regions 201a and the second channel regions 201b higher than the first channel regions 201a in impurity concentration. The first channel regions 201a are formed along the four edges of the square JFET region 204, and the second channel regions 201b are formed in contact with the four vertexes of the square JFET region 204.

In this embodiment, since the source contact region 230 is formed in the n-type source region 211 adjacent to the channels, the resistance of the portion ranging from the source contact region 230 to the channel region 201a, 201b can be lowered. On the other hand, the n-type source region 211 including the source contact region 230 is enlarged, and, as a result, the length of the JFET region 204 is enlarged. Therefore, this embodiment is advantageous over Embodiment 1 in a use in which a higher breakdown voltage is required. This is because in the case of a high breakdown voltage, it is necessary to enlarge the length of the JFET region 204, since the impurity concentration of the JFET region 204 is low and the resistance thereof is liable to be high. On the other hand, Embodiment 1 is advantageous in a use at a comparatively low breakdown voltage, since the electric field impressed on the gate oxide film is liable to be high, with the resistance of the JFET region being low.

For the manufacture of the MOSFET of this embodiment, the same or similar method to the manufacturing method in Embodiment 1 can be used.

Embodiment 3

Figure 12:
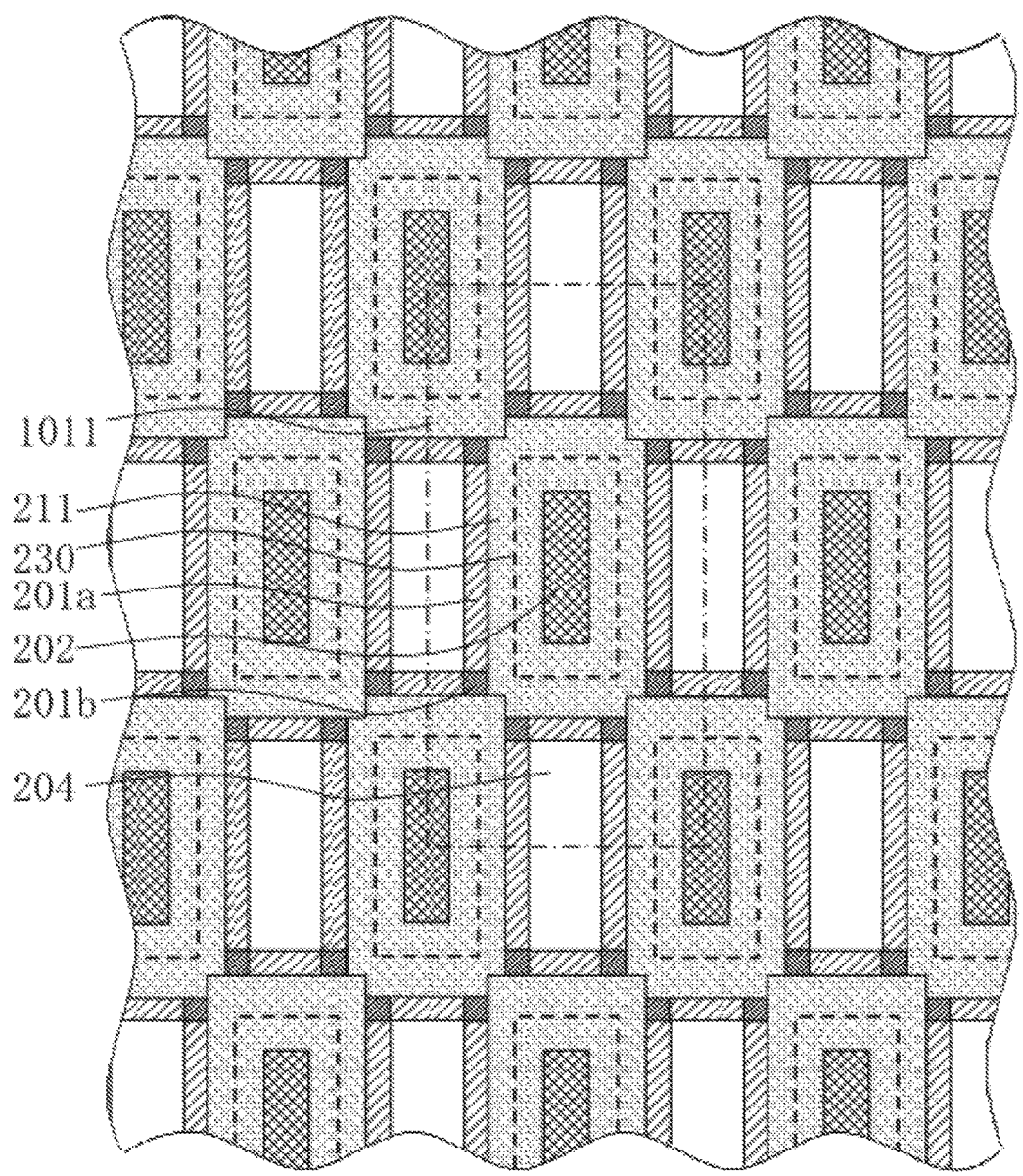
FIG. 12 is a top plan view showing a layout of unit cells of a SiC power MOSFET according to Embodiment 3 of the present disclosure.

FIG. 12 shows a top plan view of unit cells of a SiC MOSFET according to a third embodiment of the present disclosure. Embodiment 3 differs from Embodiment 2 in that the n-type source region 211 including the source contact region 230 is not square but rectangular in shape, and the unit cells 1011 are also rectangular. The n-type source regions 211 are arranged in a checkerboard-like pattern such that corners of the n-type source regions 211 overlap with one another, like in Embodiment 2.

In this embodiment, the JFET region 204 is also rectangular in shape, unlike in Embodiment 2. The first channel regions 201a and the second channel regions 201b higher than the first channel regions 201a in impurity concentration are formed on the outside of the JFET region 204. The first channel regions 201a are formed along the four edges of the rectangular JFET region 204, and the second channel regions 201b are formed in contact with the four vertexes of the rectangular JFET region 204.

In this embodiment, since the source contact region 230 is formed in the n-type source region 211 adjacent to the channels, like in Embodiment 2, the resistance of the portion ranging from the source contact region 230 to the channel can be lowered. Since the JFET region is rectangular, when the length of the shorter edges of the rectangle is shortened, the resistance of the JFET region is thereby increased, but the electric field impressed on the gate oxide film can be reduced, so that higher reliability can be obtained. Although the channel width is smaller than in Embodiment 1, the resistance of the portion ranging from the source contact region to the channel can be lowered, so that a lower ON resistance can be realized by controlling the lengths of the longer edges and the shorter edges of the rectangle.

For the manufacture of the MOSFET of this embodiment, the same or similar method to the manufacturing method in Embodiment 1 can be used.

Embodiment 4

Figure 13:
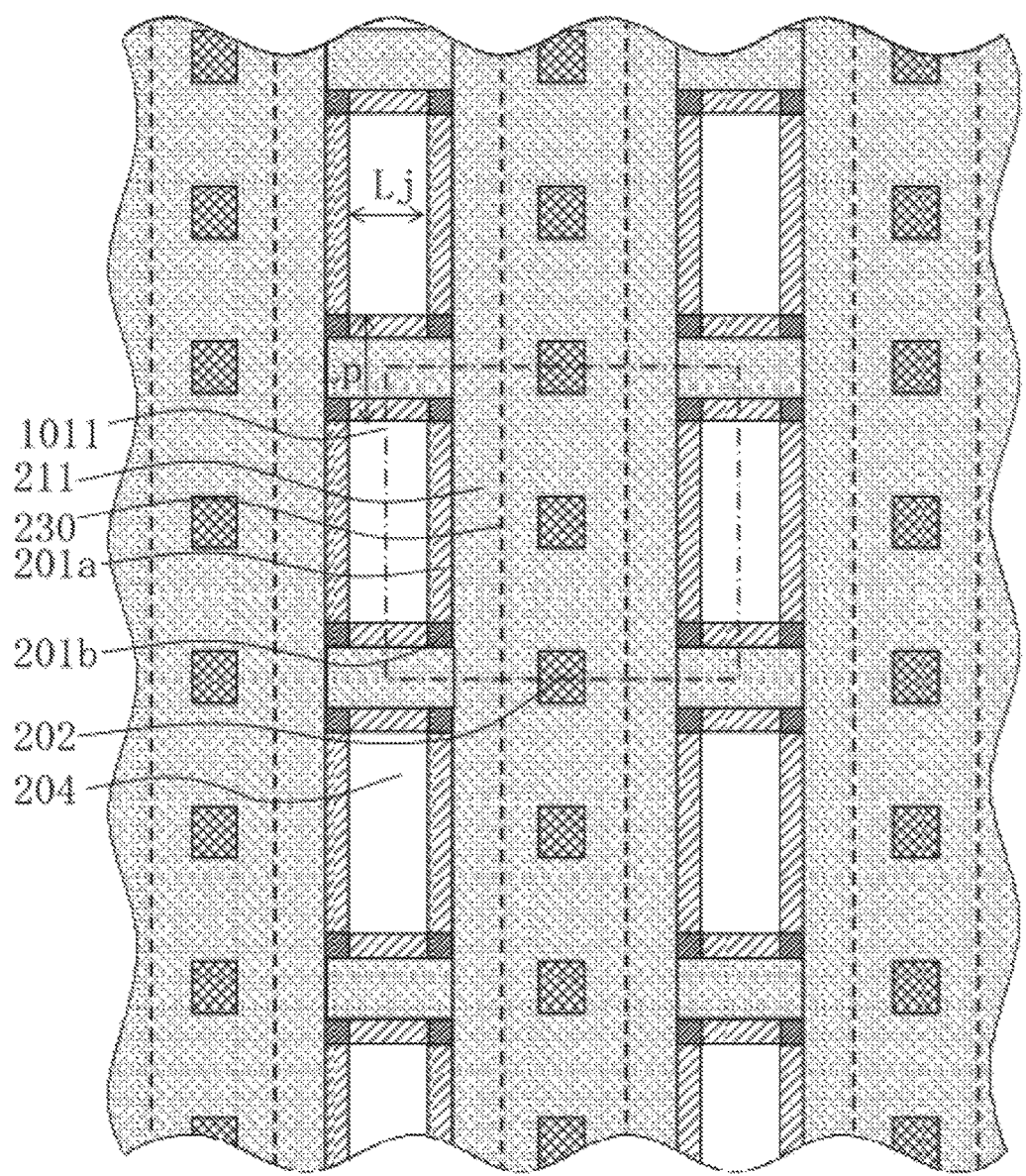
FIG. 13 is a top plan view showing a layout of unit cells of a SiC power MOSFET according to Embodiment 4 of the present disclosure.

FIG. 13 shows a top plan view of unit cells of a SiC MOSFET according to a fourth embodiment of the present disclosure. In Embodiment 4, in regard of the belt-shaped unit cells shown in FIG. 3A, the adjacent unit cells are bridged by a source region, and channel regions are provided in the horizontal direction also in the portions adjacent to the bridging source region. Therefore, the JFET region 104 is a closed region having a rectangular shape, and the first channel regions 201a and the second channel regions 201b higher than the first channel regions 201a in impurity concentration are formed on the outside of the JFET region 204. The first channel regions 201a are formed along the four edges of the rectangular JFET region 204, whereas the second channel regions 201b are formed in contact with the four vertexes of the rectangular JFET region 204. While the p$^+$-type body contact regions 202 are shown to be discrepantly aligned in the vertical direction in the figure, a p$^+$-type body contact region having a belt-like shape elongated in the vertical direction may be adopted.

Figure 3A:
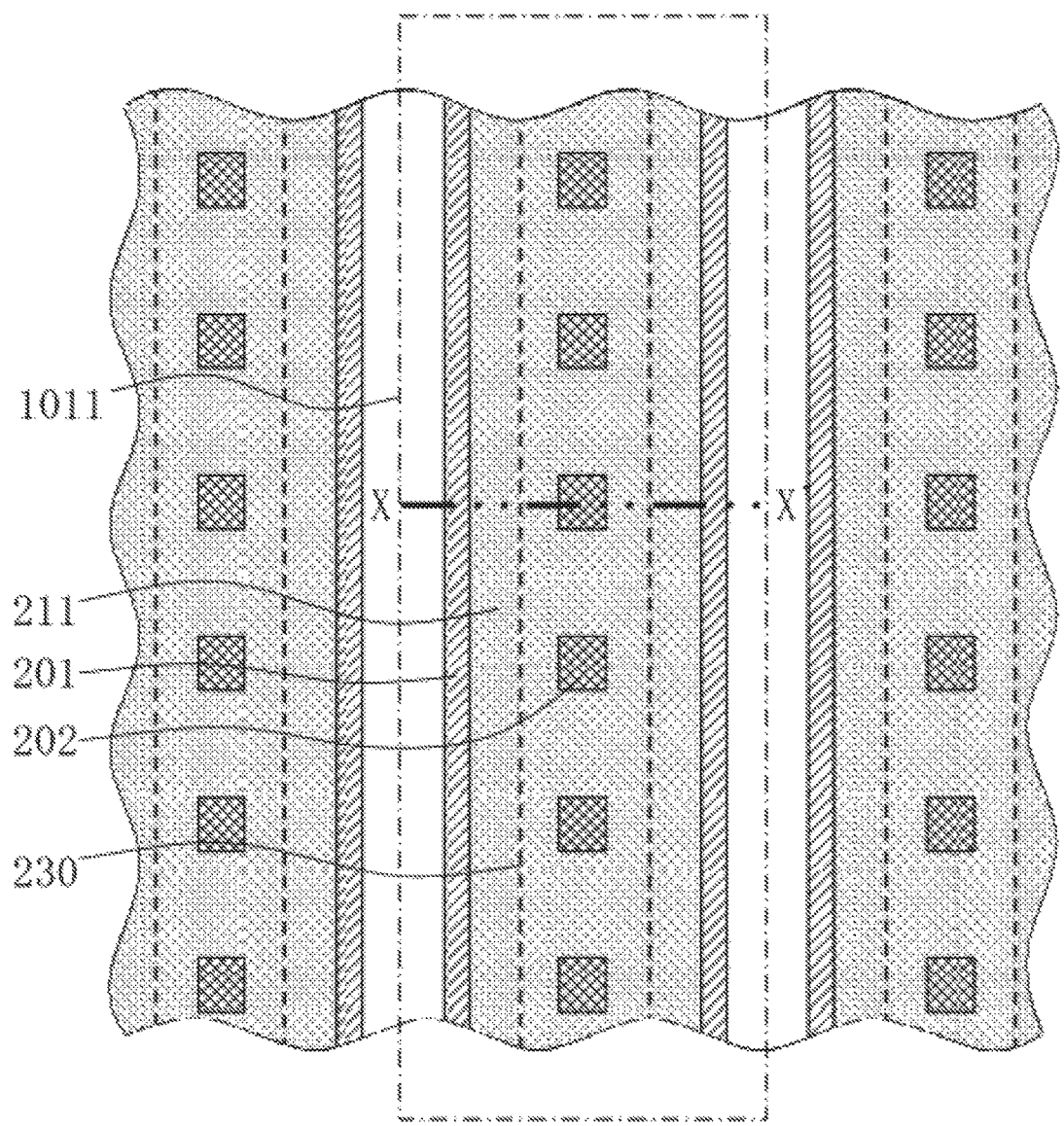
FIG. 3A is a top plan view showing one example of a unit cell of a SiC power MOSFET according to the related art.
Figure 3B:
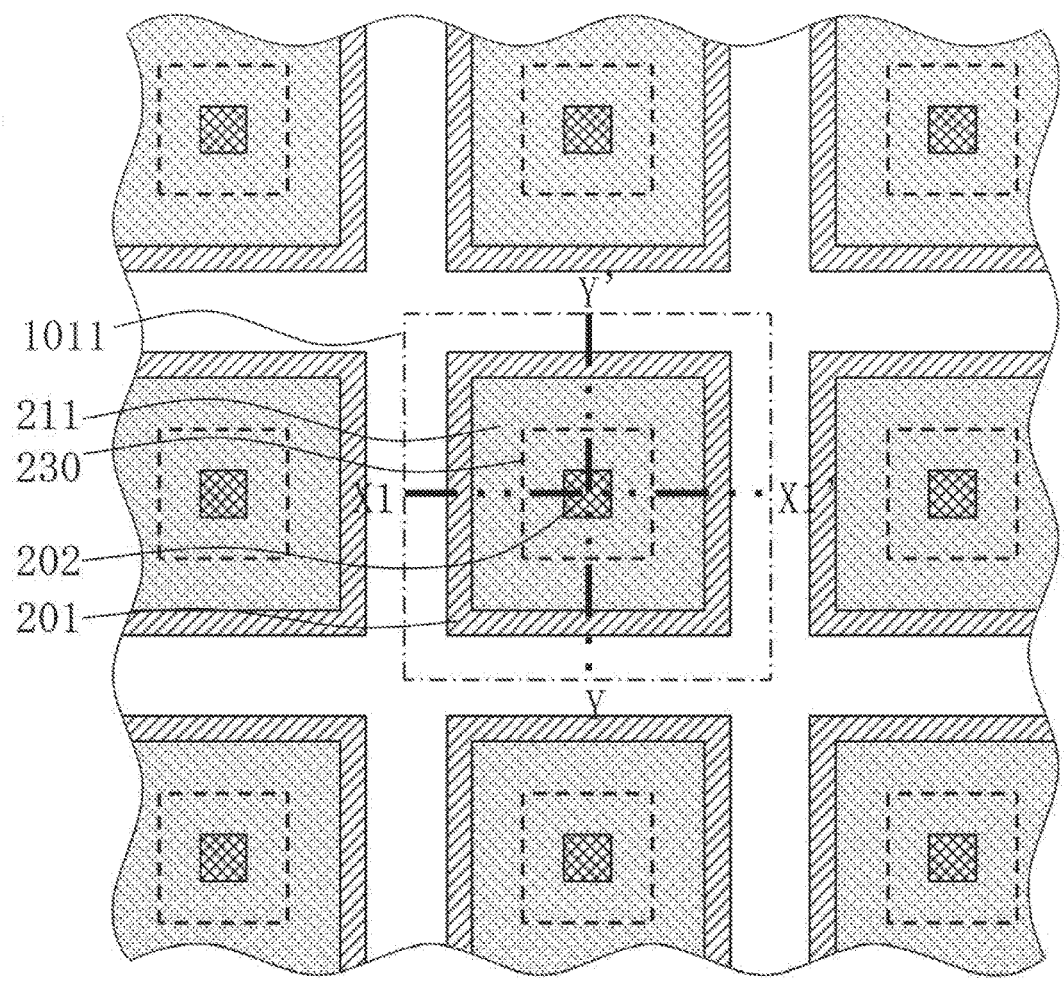
FIG. 3B is a top plan view showing one example of a unit cell of a SiC power MOSFET according to the related art.

In this embodiment, in the case where the length of the JFET region (Lj in FIG. 13) is greater than the width of the bridging region (Lp in FIG. 13), the channel width is greater than that of the belt-shaped unit cell shown in FIG. 3A. Therefore, this embodiment is advantageous in a use requiring a higher breakdown voltage in which it is necessary to enlarge the length of the JFET region since the impurity concentration of the JFET region is low.

For the manufacture of the MOSFET of this embodiment, the same or similar method to the manufacturing method in Embodiment 1 can be used.

Embodiment 5

Figure 14:
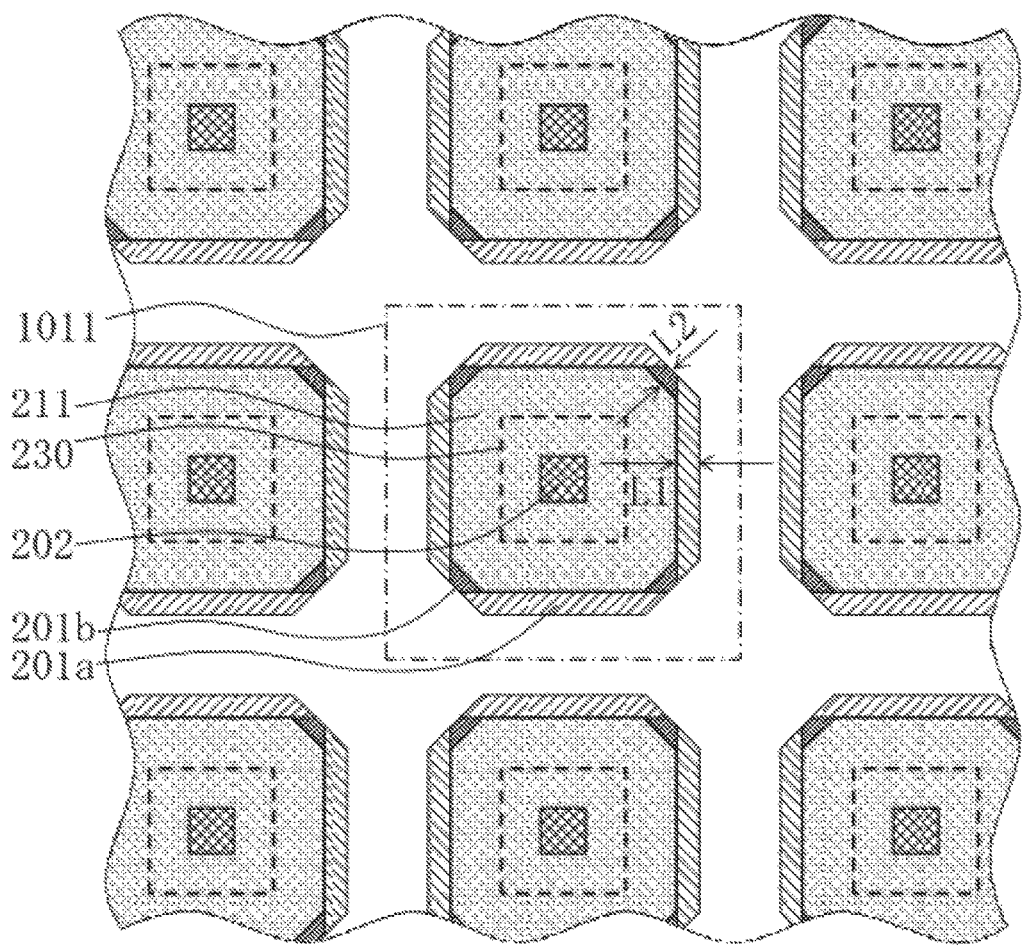
FIG. 14 is a top plan view showing a layout of unit cells of a SiC power MOSFET according to Embodiment 5 of the present disclosure.

FIG. 14 shows a top plan view of unit cells of a SiC MOSFET according to a fifth embodiment of the present disclosure. In Embodiment 5, the source regions are spaced apart from one another and are octagonal in shape. It is to be noted that the octagonal shape is not a regular octagon but has two kinds of edge lengths, wherein longer edges and shorter edges are alternately connected; in other words, the octagonal shape is an octagon shape as if obtained by cutting away the four corners (near-vertex portions) of a square. The first channel regions 201a are formed in contact with the longer edges, and the second channel regions 201b higher than the first channel regions 201a in impurity concentration are formed in contact with the shorter edges. Further, the channel length L1 of the first channel region 201a is greater than the channel length L2 of the second channel region 201b.

For the manufacture of the MOSFET of this embodiment, the same or similar method to the manufacturing method in Embodiment 1 can be used.

Figure 15:
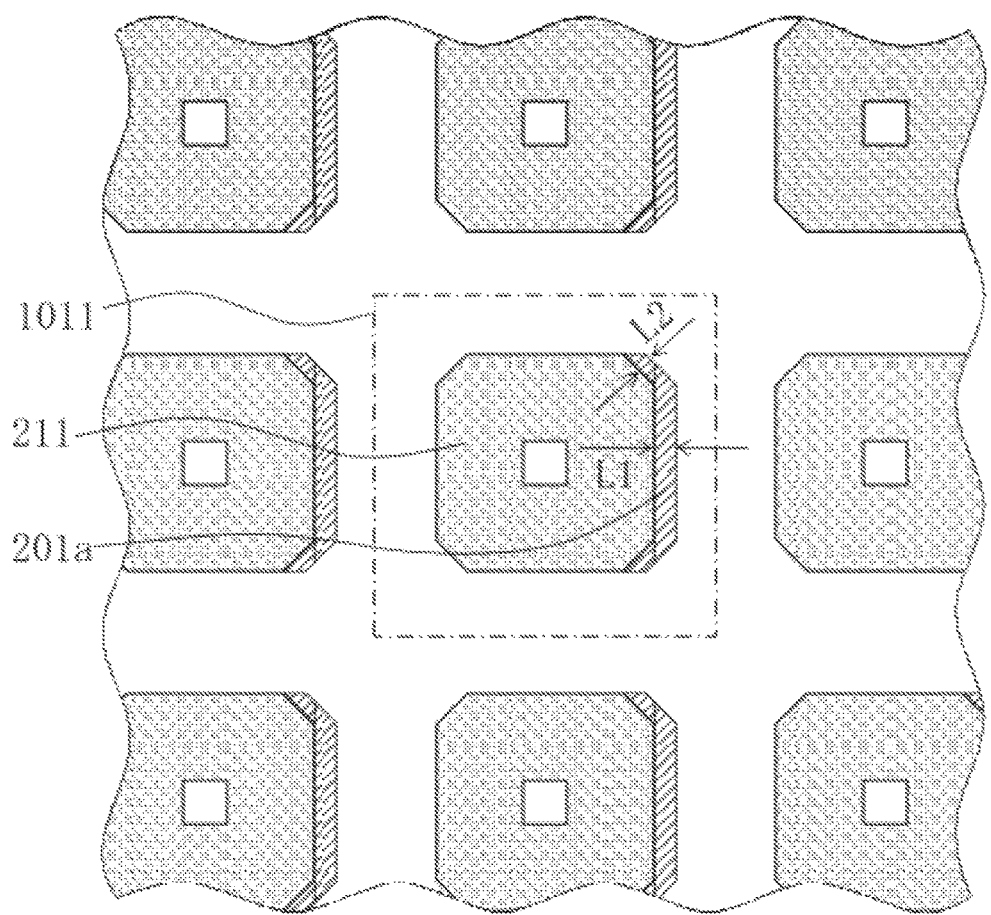
FIG. 15 is a top plan view showing the layout of the unit cells, in a step of a manufacturing method of the SiC power MOSFET according to Embodiment 5.

FIG. 15 shows a top plan view in a step at the time of formation of the channel regions, particularly. When a mask having octagonal opening portions is formed and then p-type impurity is implanted in a direction inclined from the normal to the substrate, by the same or similar method to that in Embodiment 1, the channel regions are formed as illustrated in FIG. 15. In this instance, the channel length L2 of the portion in contact with the shorter edge is smaller than the channel length L1 of the portion in contact with the longer edge, and, roughly, $L1 \approx L2 \times \sqrt{2}$. When four implantation steps are carried out, the channel regions in contact with the shorter edges are subjected to two implantation steps in an overlapping manner, whereby the second channel regions higher in impurity concentration than the first channel regions along the longer edges are formed. As a result of the four implantation steps, for example, the channel length L1 of the first channel regions 201a becomes 1.1 to 1.7 times the channel length L2 of the second channel regions 201b.

The present disclosure is widely applicable to power semiconductor devices to be used mainly for high-voltage high-current applications. According to the present disclosure, a high-reliability and high-performance vertical DMOSFET structure having channels formed on a self-alignment basis can be manufactured. Particularly, the present disclosure is advantageous when applied to a power semiconductor device configured by a short-channel DMOSFET having a channel length of equal to or less than 2 μm.

The present disclosure is not limited to the above-described embodiments but includes various modifications. For instance, part of the configuration of an embodiment can be replaced by the configuration of another embodiment, and to the configuration of an embodiment can be added the configuration of another embodiment. Besides, with respect to part of the configuration of each embodiment, addition, deletion, replacement of or by the configurations of other embodiments can be made.

The functions of the "source" and the "drain" of a transistor may be reversed, in the case of adopting a transistor of a different polarity, the case where the direction of current is changed in circuit operation, or the like. For this reason, the terms "source" and "drain" herein can be used in a reversed manner.

The terms "electrode" and "wiring" in the present specification and the like do not restrict the configurational components on a functional basis. For instance, an "electrode" may be used as part of a "wiring," and vice versa. Furthermore, the terms "electrode" and "wiring" include the cases where pluralities of "electrodes" and "wirings" are formed in an integral form.

What is claimed is:

1. A semiconductor device having an active region in which a plurality of unit cells are regularly arranged, each of the unit cells comprising:
a channel region formed over a front surface of a semiconductor substrate and having a first conductivity type;
a source region having a second conductivity type different from the first conductivity type and formed over the front surface of the semiconductor substrate so as to be in contact with the channel region; and
a JFET region having the second conductivity type and formed over the front surface of the semiconductor substrate on an opposite side of the channel region from the source region such as to be in contact with the channel region,
wherein the channel region is comprised of a first channel region and a second channel region higher than the first channel region in impurity concentration, and
wherein said first and second channel regions are arranged along first and second directions, respectively, so as to surround outer edge portions of said source region of each said unit cell in a plan view.

2. The semiconductor device according to claim 1, wherein the impurity concentration of the second channel region is 1.6 to 2.5 times the impurity concentration of the first channel region.

3. The semiconductor device according to claim 1, wherein the unit cell is rectangular or square in shape.

4. The semiconductor device according to claim 1, wherein the JFET region is a rectangular region,
the first channel region is formed along an edge of the JFET region, and
the second channel region is formed in contact with a vertex of the JFET region.

5. The semiconductor device according to claim 1, wherein the JFET region is surrounded by the channel region.

6. The semiconductor device according to claim 1, wherein the source region constituting the unit cell is formed in such a manner that the source regions of the adjacent unit cells are separate from each other, and is octagonal in shape.

7. The semiconductor device according to claim 6, wherein edges constituting the octagon have two or three kinds of lengths, the first channel region is formed along a longest edge, and the second channel region is formed along a shortest edge.

8. The semiconductor device according to claim 6, wherein a channel length of the first channel region is 1.1 to 1.7 times the channel length of the second channel region.

9. The semiconductor device according to claim 1, comprising:
a gate insulating film formed over the channel region and at least part of the source region;

a gate electrode formed over at least part of the gate insulating film;
a body region having the first conductivity type and formed under the source region;
a body contact region having the first conductivity type, formed in contact with the body region and higher than the body region in impurity concentration;
a source electrode in contact with the body contact region; and
a drain electrode formed on a surface opposite to the front surface of the semiconductor substrate.

\* \* \* \* \*